(12) United States Patent
Myung et al.

(10) Patent No.: US 7,347,950 B2
(45) Date of Patent: Mar. 25, 2008

(54) RIGID FLEXIBLE PRINTED CIRCUIT BOARD AND METHOD OF FABRICATING SAME

(75) Inventors: Bum Young Myung, Chungcheongnam-do (KR); Dong Kuk Kim, Gyeonggi-do (KR); Young Po Park, Chungcheongnam-do (KR); Young Seok Yoon, Chungcheongnam-do (KR); Dek Gin Yang, Chungcheongbuk-do (KR)

(73) Assignee: Samsung Electro-Mechanics, Co., Ltd., Kyunggi-do (KR)

( * ) Notice: Subject to any disclaimer, the term of this patent is extended or adjusted under 35 U.S.C. 154(b) by 324 days.

(21) Appl. No.: 11/214,965

(22) Filed: Aug. 29, 2005

(65) Prior Publication Data

US 2006/0193970 A1   Aug. 31, 2006

(30) Foreign Application Priority Data

Feb. 25, 2005 (KR) .................. 10-2005-0016044
Jun. 27, 2005 (KR) .................. 10-2005-0055647

(51) Int. Cl.
*H01B 13/00* (2006.01)
*H05K 3/02* (2006.01)
*H05K 3/10* (2006.01)

(52) U.S. Cl. ............................. 216/13; 29/846
(58) Field of Classification Search .............. 216/13, 216/17–20; 174/254, 256; 29/846; 428/209
See application file for complete search history.

(56) References Cited

U.S. PATENT DOCUMENTS 6,099,745 A * 8/2000 McKenney et al. ............ 216/13
6,162,996 A * 12/2000 Schmidt et al. ............ 174/259
6,745,463 B1   6/2004 Chou

FOREIGN PATENT DOCUMENTS

JP   63-293991   11/1988
JP   2001-284744   10/2001
JP   2006-196800   7/2006

\* cited by examiner

*Primary Examiner*—Roberts Culbert
(74) *Attorney, Agent, or Firm*—Darby & Darby P.C.

(57) ABSTRACT

A rigid flexible printed circuit board (PCB) and a method of fabricating the same. Since a polyimide copper clad laminate is not used during the fabrication of the rigid flexible PCB, an increase in cost resulting from use of the polyimide copper clad laminate and poor reliability of adhesion at an interface between different materials are avoided.

13 Claims, 23 Drawing Sheets

A

101

RIGID FLEXIBLE PRINTED CIRCUIT BOARD AND METHOD OF FABRICATING SAME

INCORPORATION BY REFERENCE

The present application claims priority under 35 U.S.C. §119 to Korean Patent Application Nos. 10-2005-0016044 filed on Feb. 25, 2005 and 10-2005-0055647 filed on Jun. 27, 2005. The content of the applications is incorporated herein by reference in its entirety.

BACKGROUND OF THE INVENTION

1. Field of the Invention

The present invention relates, in general, to a rigid flexible printed circuit board (PCB) and a method of fabricating the same and, more particularly, to a rigid flexible PCB and a method of fabricating the same, in which a polyimide copper clad laminate is not used during the fabrication of the rigid flexible PCB so as to avoid an increase in cost resulting from use of the polyimide copper clad laminate and poor reliability of adhesion at an interface between different materials.

2. Description of the Related Art

In accordance with the recent trend toward miniaturized, light, and slim electronic devices, light, slim, and high density PCBs are in demand. Accordingly, the use of a multilayered flexible PCB capable of satisfying the above demand is rapidly growing. However, a process of fabricating the multilayered flexible PCB is complicated and has many stages compared to a process of fabricating a general rigid PCB, thus costs and defective fractions are high. Of multilayered rigid PCBs, recently, a rigid flexible PCB having a flexible portion has been employed to produce folding-type mobile phones, thus it is expected that demand for rigid flexible PCBs will rapidly grow. The flexible portion of the rigid flexible PCB reduces workability in a process of producing goods and increases defective fractions. The development of special material and a process employing same contribute to solving the above problems, thereby assuring superiority over rival companies. In order to fabricate the flexible PCB, the formation of microcircuits using thin and strong material must be feasible. In other words, the selection of material and process is important. Polyimide resin has mainly been used as the material because there is no material usable as a substitute for polyimide resin with regard to heat resistance, mechanical strength, fire retardancy, and electrical properties. However, currently, material capable of being used as a substitute for polyimide resin has been developed with regard to high frequency response, moisture resistance, dimensional stability, and cost.

In accordance with miniaturization and integration of electronic parts, various multilayered circuit boards capable of having the electronic parts mounted thereon have been developed. Of them, many studies have been made of a rigid flexible multilayered PCB (hereinafter, referred to as "rigid flexible PCB") which is capable of minimizing the volume occupied by a substrate and of being modified in three dimensions.

In the rigid flexible PCB, it is possible to combine a plurality of boards in one PCB without additional connectors or cables for connecting boards to each other, thus there are advantages in that there is little delay or distortion of an electric signal and a volume of space for mounting can be reduced. Accordingly, it is considered that it can be used for a static & dynamic application which allows bending only once and an application for a few hundred thousand cycles. However, since costly flexible polyimide copper clad laminate is employed, the fabrication cost is 3-4 times as high as that of a typical rigid flexible PCB. As well, poor adhesion strength at an interface of the prepreg (or bonding sheet), which is used as an interlayer adhesive to form multilayered rigid portions, and polyimide has been indicated as a disadvantage in the fabrication of the PCB and in the realization of reliability for a long time. Particularly, recently, the cost burden of polyimide material is growing heavier in accordance with the decrease of the price of PCBs, and the use of connectors or cables, which belongs to a con to con connection manner, is increasing again in some fields. However, in consideration of delay of the electric signal or the trend toward light, slim, short, and small electronic products, the fabrication of a low-priced rigid flexible PCB employing a novel process is in demand.

FIGS. 1A to 1I are sectional views illustrating the fabrication of a rigid flexible PCB, according to conventional technology.

As shown in FIG. 1A, a prepreg 101 through which a window (A) is formed at a predetermined position thereof is prepared.

As shown in FIG. 1B, polyimide copper clad laminates which include polyimide films 102a, 102b and copper foil layers 103a, 103b are layered on both sides of the prepreg 101.

As shown in FIG. 1C, dry films 104a, 104b or liquid photoresists are applied on the copper foil layers 103a, 103b.

As shown in FIG. 1D, artwork films having predetermined patterns printed thereon are attached to the dry films 104a, 104b, exposed, and developed to form predetermined etching resist patterns. Furthermore, the resulting structure is dipped in an etching solution, and, at this time, the dry films 104a, 104b act as an etching resist. Thereby, portions of the copper foil layers 103a, 103b, which correspond in position to portions other than the predetermined patterns of the dry films 104a, 104b, are removed.

As shown in FIG. 1E, the dry films 104a, 104b are removed using a stripping solution to form predetermined circuit patterns 103a, 103b.

As shown in FIG. 1F, coverlays 105a, 105b are applied on the circuit patterns 103a, 103b which correspond in position to the window (A) at the predetermined position, and are then pressed.

As shown in FIG. 1G, prepregs 106a, 106b which are prepared in FIG. 1a, are layered on the circuit patterns 103a, 103b so as to expose a portion of the coverlays 105a, 105b.

As shown in FIG. 1H, polyimide copper clad laminates which include polyimide films 107a, 107b and copper foil layers 108a, 108b are layered on the prepregs 106a, 106b which constitute outermost layers, and are then subjected to a photolithography process to form predetermined circuit patterns 108a, 108b.

As shown in FIG. 1I, the step of FIG. 1H is repeated once to apply coverlays 113a, 113b on portions of the outermost circuit patterns 108a, 108b, which correspond in position to the window (A) at the predetermined position, and the resulting structure is pressed to create the rigid flexible PCB.

As a related technology, U.S. Pat. No. 6,745,463 discloses a method of fabricating a rigid flexible PCB.

However, in the conventional PCB, a polyimide copper clad laminate and a prepreg made of different materials constitute a rigid region, thus adhesion strength is reduced. To avoid this, the polyimide copper clad laminate must be surface treated using additional plasma (or corona) treatment or mechanical brushing.

Additionally, in the conventional PCB, since a coverlay is laminated on the polyimide copper clad laminate on which a circuit pattern is formed, the circuit pattern is curled toward a curved portion of the coverlay due to coefficient of thermal expansion (CTE) of adhesive of the coverlay when thermal hysteresis occurs (surface mount process, etc.), thus mounting of surface mount devices is unsatisfactorily conducted, resulting in increased defective fractions.

Another problem is that, since cost of the polyimide copper clad laminate is higher than that of the prepreg, it is impossible to form a low-priced rigid flexible copper clad laminate.

SUMMARY OF THE INVENTION

Accordingly, the present invention has been made keeping in mind the above problems occurring in the prior art, and an object of the present invention is to provide a low-priced rigid flexible PCB having no polyimide copper clad laminate, in which the reliability of adhesion is excellent, bendability is realized, and there are no bursts in a bent portion, and a method of fabricating the same.

In order to accomplish the above object, the present invention provides a method of fabricating a rigid flexible PCB. The method includes the steps of preparing a circuit layer including a first insulating layer through which a first window is formed, an internal circuit pattern which is formed on a side of the first insulating layer having the first window, and first and second protective films for protecting a portion of the internal circuit pattern formed in the first window; preparing a second insulating layer through which a second window is formed so as to correspond to the first window; layering a plurality of circuit layers and a plurality of second insulating layers to form a laminate; and forming external layers, through which third windows are formed so as to correspond to the first and second windows, on upper and lower sides of the laminate. Each of the external layers comprises an external circuit pattern which corresponds to the internal circuit pattern, and third and fourth protective films which protect a portion of the external circuit pattern formed in each of the third windows. A portion corresponding to the first, second, and third windows is a flexible portion.

Preferably, the step of preparing a circuit layer further includes the steps of providing the first insulating layer through which the first window is formed, applying the first protective film on a side of the first insulating layer to cover the first window, layering a copper foil layer on the other side of the first insulating layer, forming the internal circuit pattern on the copper foil layer, and applying the second protective film to protect a portion of the internal circuit pattern formed in the first window in conjunction with the first protective film.

Preferably, the step of preparing a circuit layer further includes the steps of applying the first protective film having a predetermined size on a side of the copper foil layer, layering the first insulating layer, through which the first window that is smaller than the first protective film is formed, on the side of the copper foil layer to expose a portion of the first protective film, forming the internal circuit pattern on the copper foil layer, and applying the second protective film on the internal circuit pattern so that the second protective film corresponds to the first protective film and protects the internal circuit pattern.

It is preferable that the first insulating layer and the second insulating layer be a prepreg or a bonding sheet.

The first, second, third, and fourth protective films are a typical film type of coverlay, a liquid type of coverlay, or a dry film type of coverlay.

Preferably, the step of forming external layers includes the steps of layering preliminary external layers on the upper and lower sides of the laminate, forming the external circuit pattern through which a plurality of via holes is formed on the copper foil layer, and applying the fourth protective film to seal the third window and protect a portion of the external circuit pattern in the third window in conjunction with the third protective film, thereby forming the external layers. Each of the preliminary external layers comprises a third insulating layer through which the third window having a size and a position that are identical to those of the first window and the second window is formed, and the third protective film which is formed on the third insulating layer to cover the copper foil layer formed on a side of the third insulating layer and the third window.

Preferably, the plurality of via holes includes through holes and blind via holes in the step of forming the external circuit pattern.

The rigid flexible PCB according to an embodiment of the present invention is fabricated through the above method.

In order to accomplish the above object, the present invention also provides a method of fabricating a rigid flexible PCB. The method includes the steps of forming first and second internal circuit patterns, which are electrically connected to each other, on both sides of a first insulating layer through which a first window is formed, and applying first, second, third, and fourth protective films, which correspond to the first window, on both sides of the first insulating layer to protect portions of the first and second internal circuit patterns in the first window, thus preparing a circuit layer, (B) preparing a second insulating layer through which a second window is formed so as to correspond to the first window, (C) layering a plurality of circuit layers and a plurality of second insulating layers to form a laminate, and (D) forming external layers, through which third windows are formed so as to correspond to the first and second windows, on upper and lower sides of the laminate. Each of the external layers comprises an external circuit pattern which corresponds to the first and second internal circuit patterns, and fifth and sixth protective films which protect a portion of the external circuit pattern formed in each of the third windows. A portion corresponding to the first, second, and third windows is a flexible portion.

Preferably, the step of forming first and second internal circuit patterns includes the steps of providing the first insulating layer through which the first window is formed, applying the first protective film and the second protective film on upper and lower sides of the first insulating layer to cover the first window, layering a copper foil layer on the upper and lower sides of the first insulating layer on which the first protective film and the second protective film are applied, forming an internal via hole through the copper foil layer, and conducting electroless and electrolytic copper plating processes, forming the first and second internal circuit patterns on the copper foil layer, and applying the third protective film and the fourth protective film on the first protective film and the second protective film to protect the first and second internal circuit patterns.

It is preferable that the first insulating layer and the second insulating layer be a prepreg or a bonding sheet.

The first, second, third, fourth, fifth, and sixth protective films are a typical film type of coverlay, a liquid type of coverlay, or a dry film type of coverlay.

Preferably, the step of forming external layers includes the steps of layering preliminary external layers on the upper and lower sides of the laminate, forming the external circuit pattern through which a plurality of via holes is formed on the copper foil layer, and applying the sixth protective film to seal the third window and protect the external circuit pattern in conjunction with the fifth protective film, thereby forming the external layers. Each of the preliminary external layers comprises a third insulating layer through which the third window having a size and a position that are identical to those of the first window and the second window is formed, and the fifth protective film which is formed on the third insulating layer to cover the copper foil layer formed on a side of the third insulating layer and the third window.

Preferably, the plurality of via holes includes through holes and blind via holes in the step of forming the external circuit pattern.

The rigid flexible PCB according to another embodiment of the present invention is fabricated through the above method.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Hereinafter, a detailed description will be given of a rigid flexible PCB, which does not comprise a polyimide copper clad laminate, and a method of fabricating the same according to the present invention, referring to the accompanying drawings.

FIGS. 2A to 3K show the fabrication of a six-layered rigid flexible PCB through single-side lamination.

Figure 1A:
FIGS. 1A to 1I are sectional views illustrating the fabrication of a rigid flexible PCB, according to conventional technology.
Figure 1B:
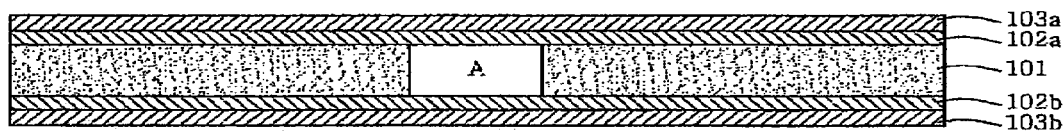
Figure 1C:
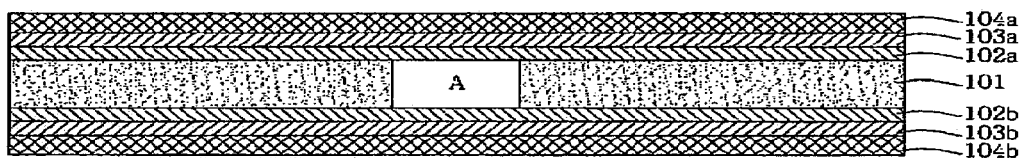
Figure 1D:
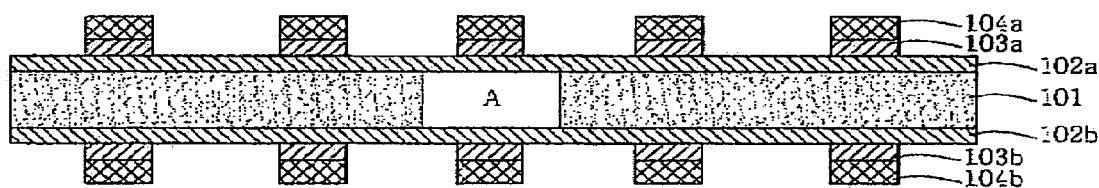
Figure 1E:
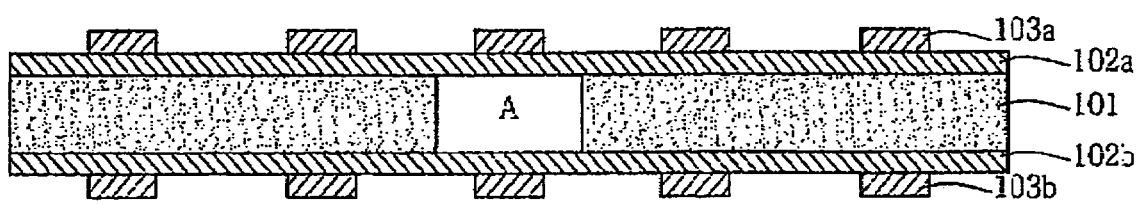
Figure 1F:
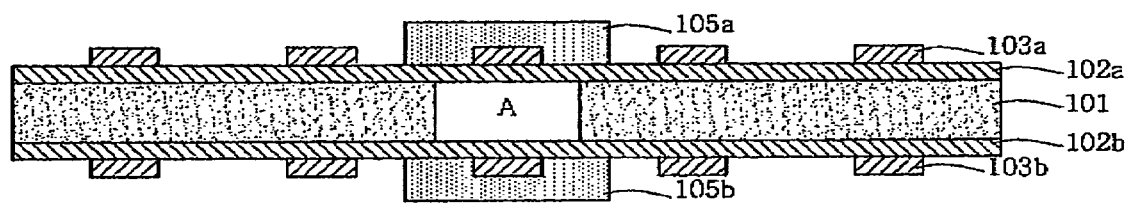
Figure 1G:
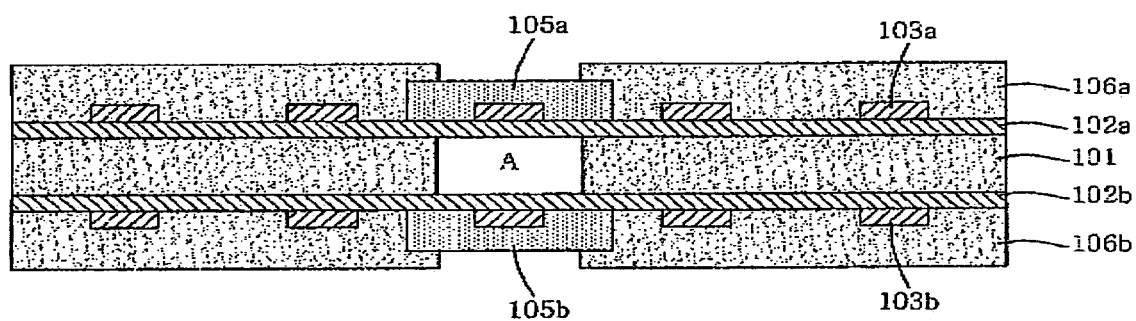
Figure 1H:
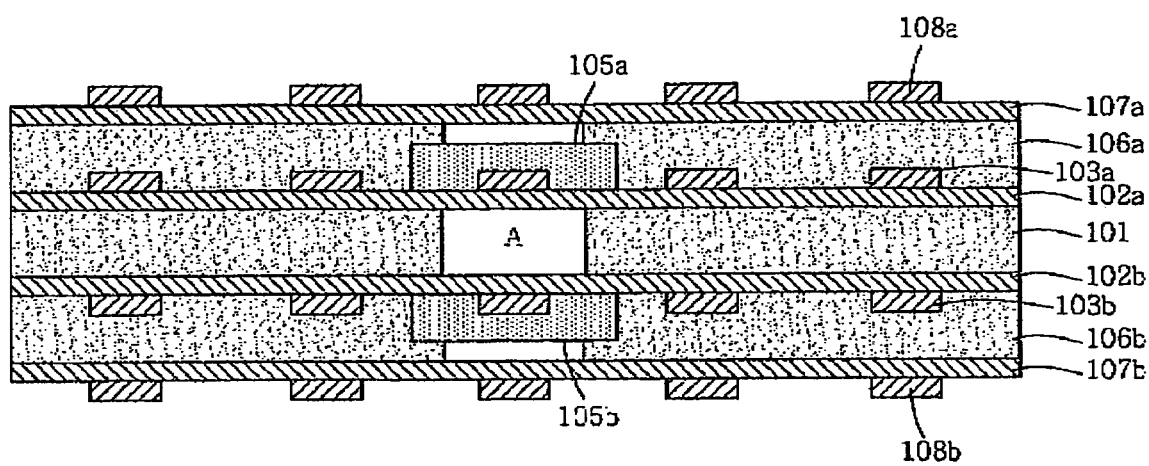
Figure 1I:
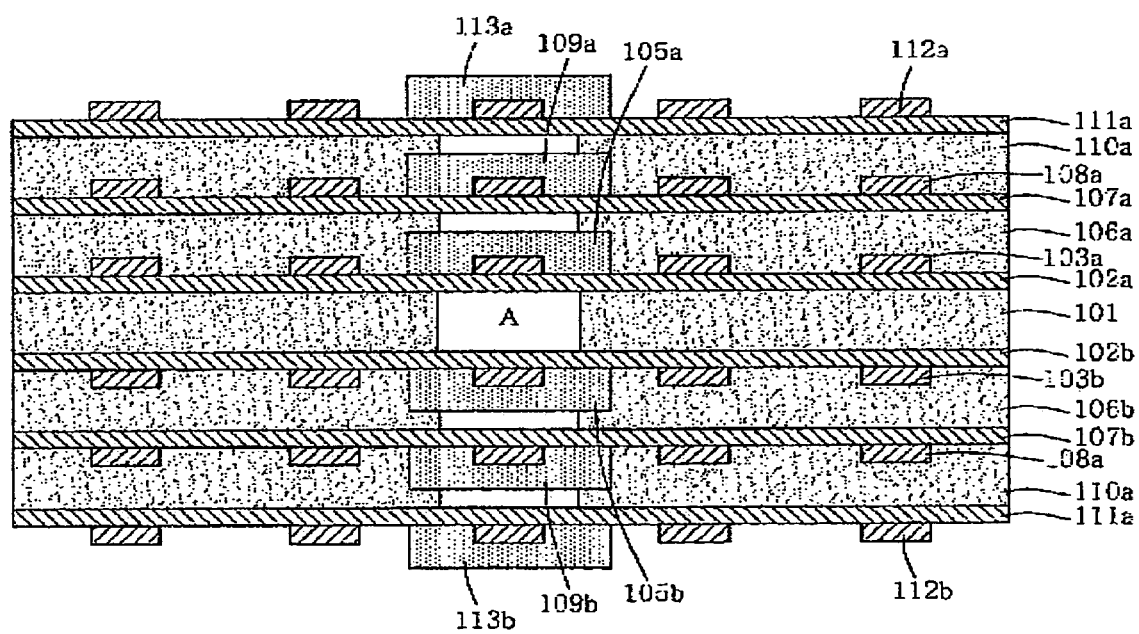
Figure 2A:
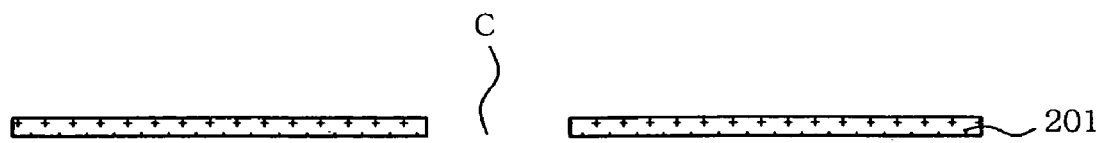
FIGS. 2A to 2R are sectional views illustrating the fabrication of a rigid flexible PCB, according to an embodiment of the present invention.
Figure 2B:
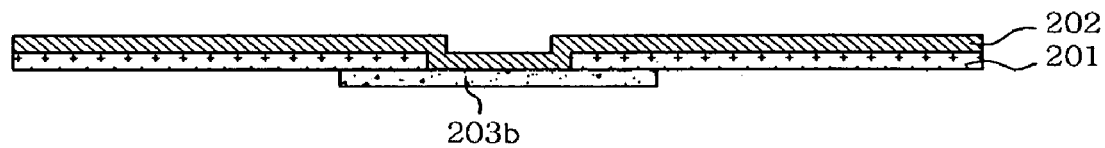
Figure 2C:
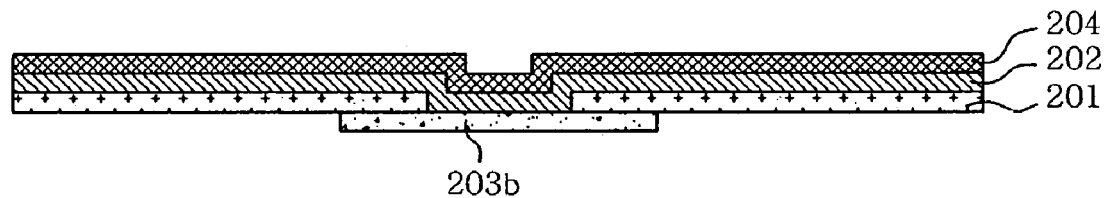
Figure 2D:
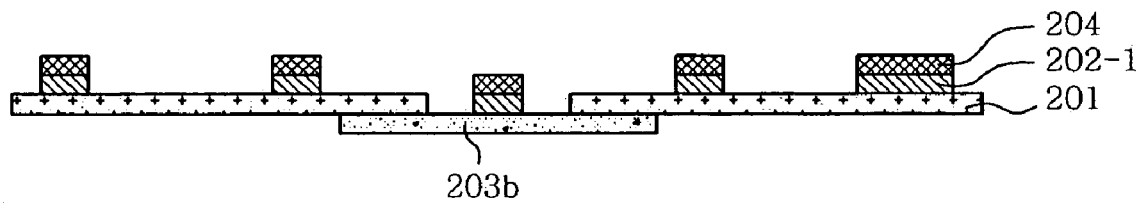
Figure 2E:
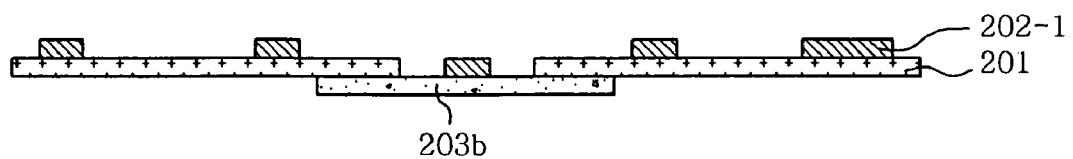
Figure 2F:
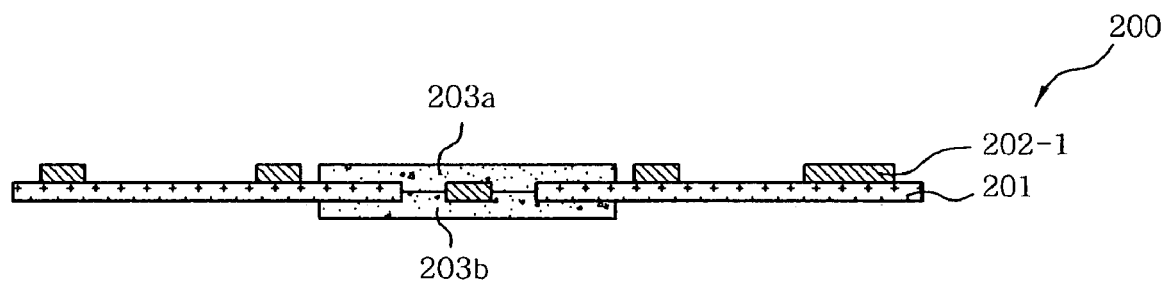
Figure 2G:
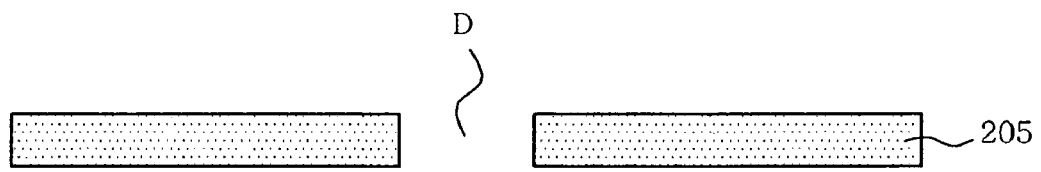
Figure 2H:
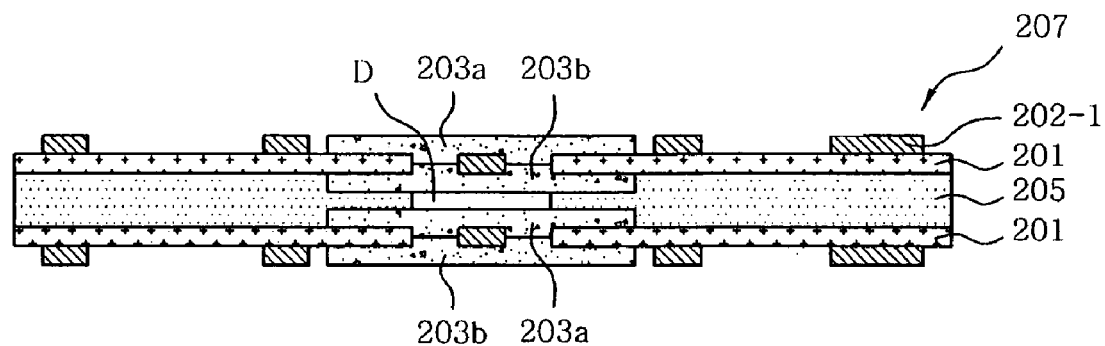
Figure 2I:
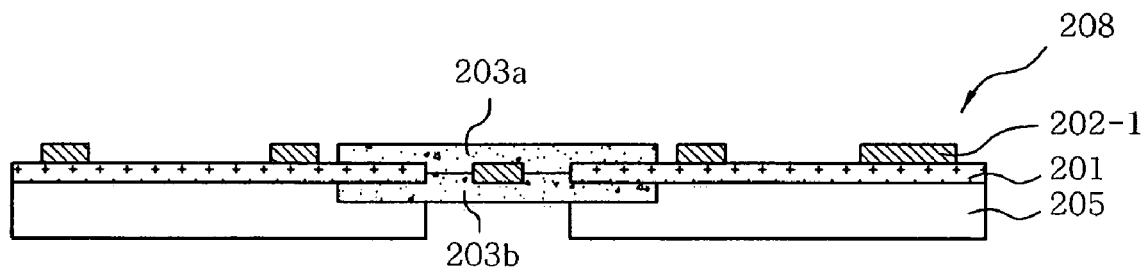
Figure 2J:
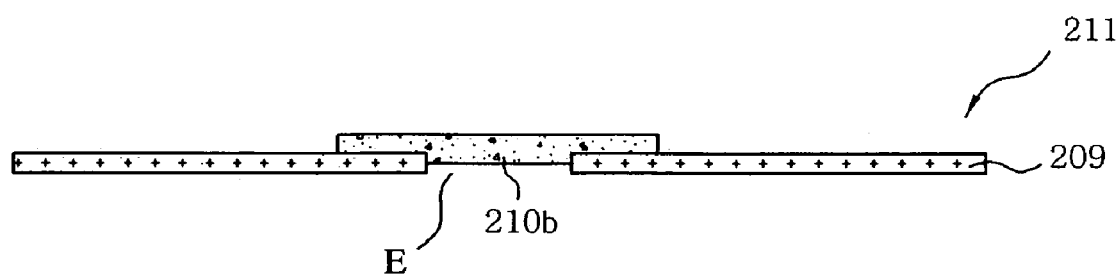
Figure 2K:
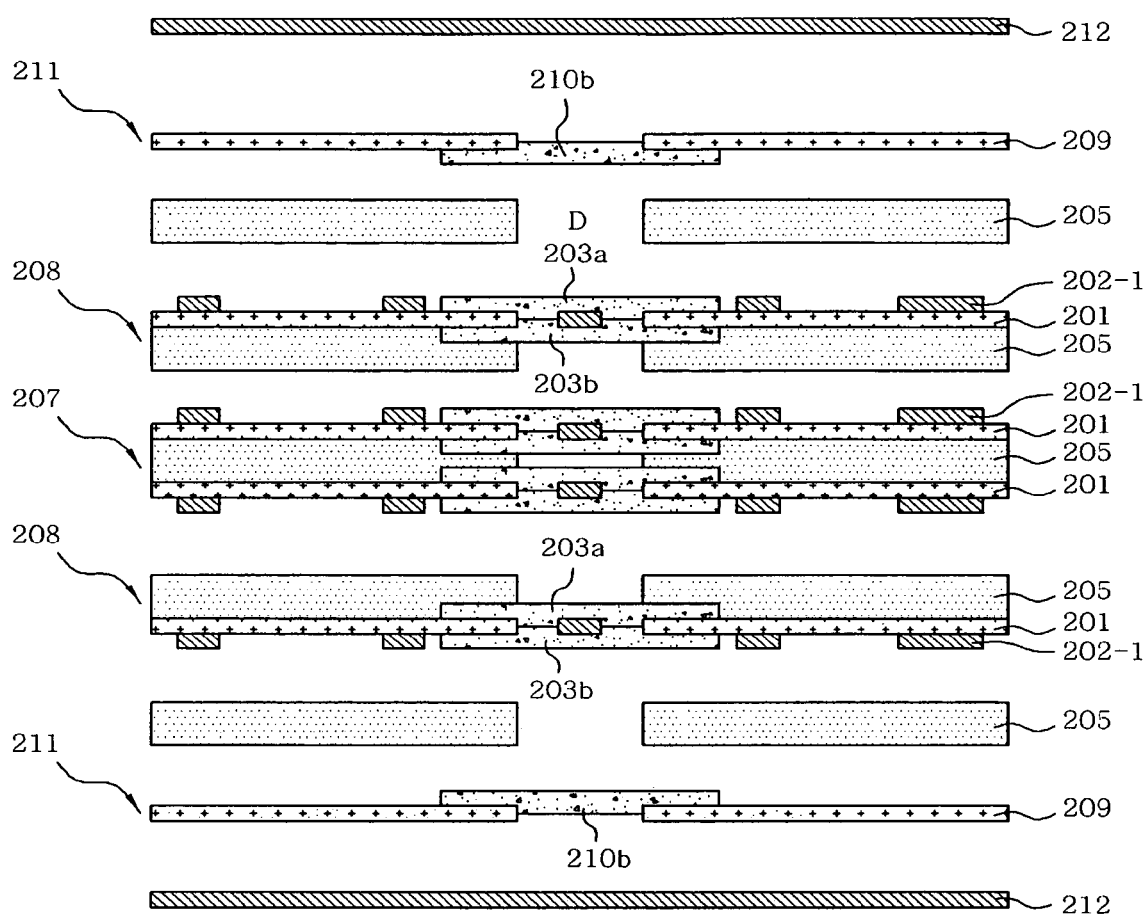
Figure 2L:
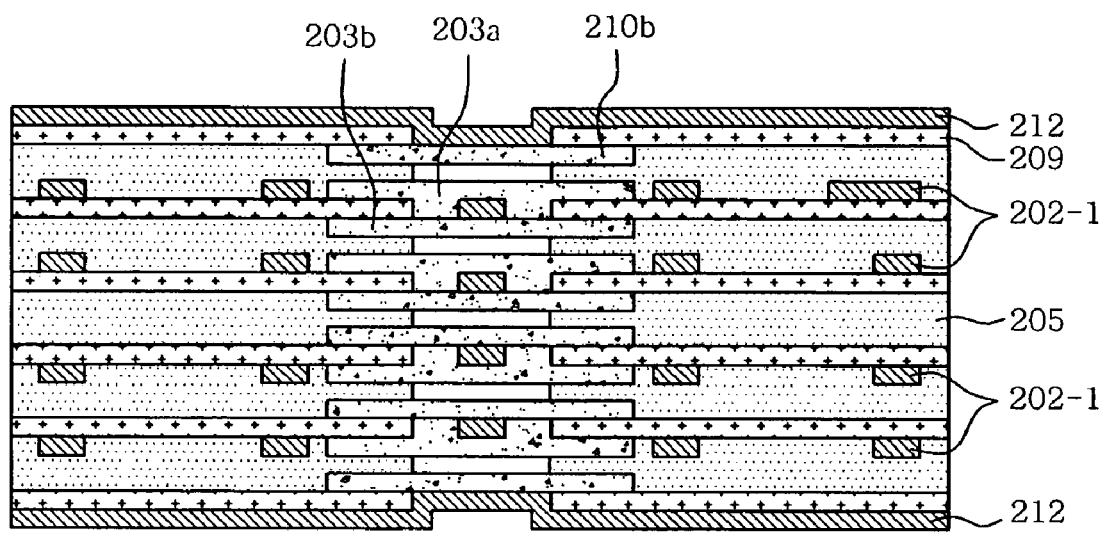
Figure 2M:
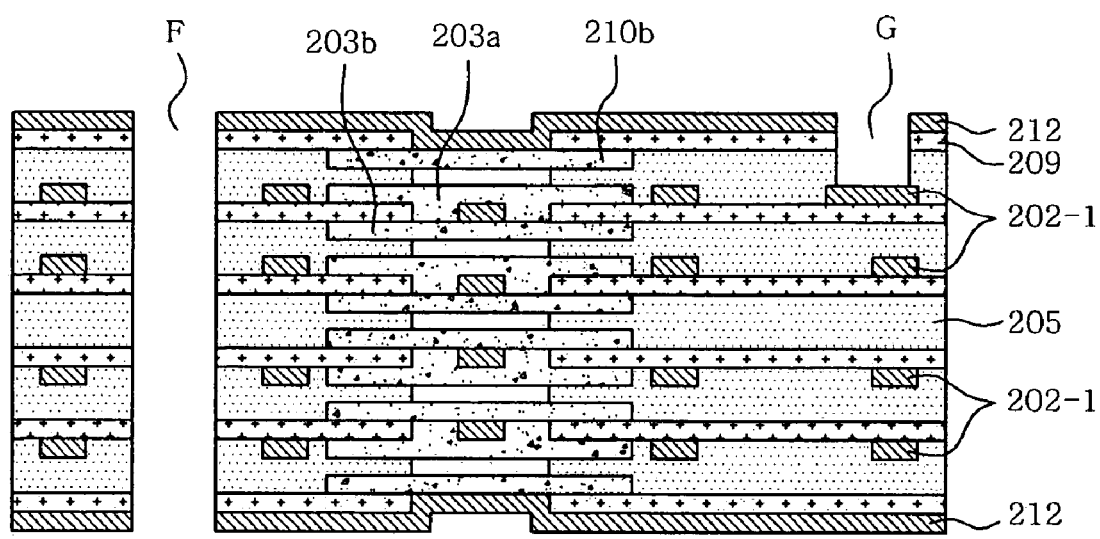
Figure 2N:
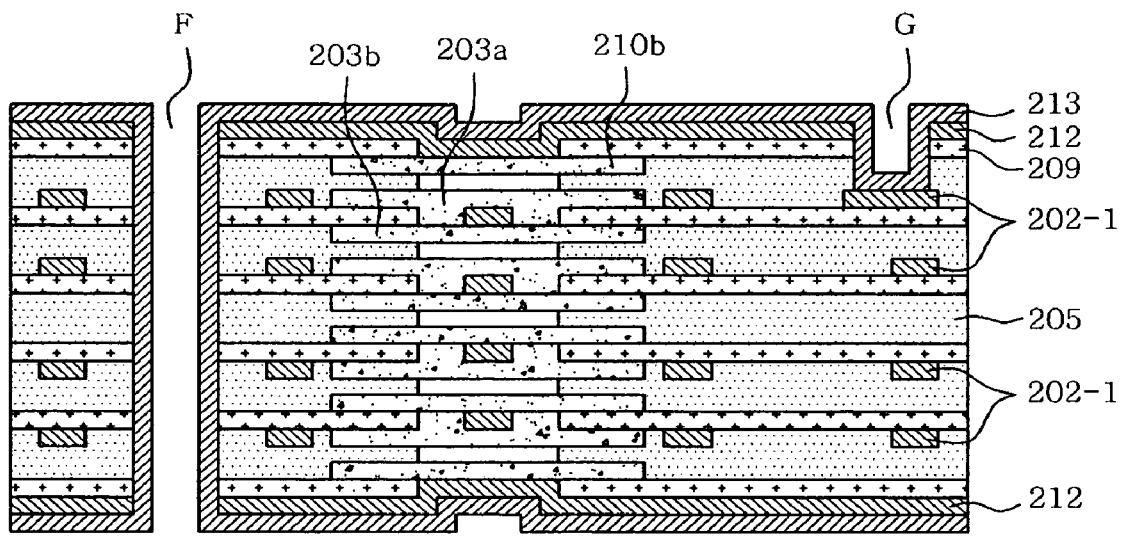
Figure 2O:
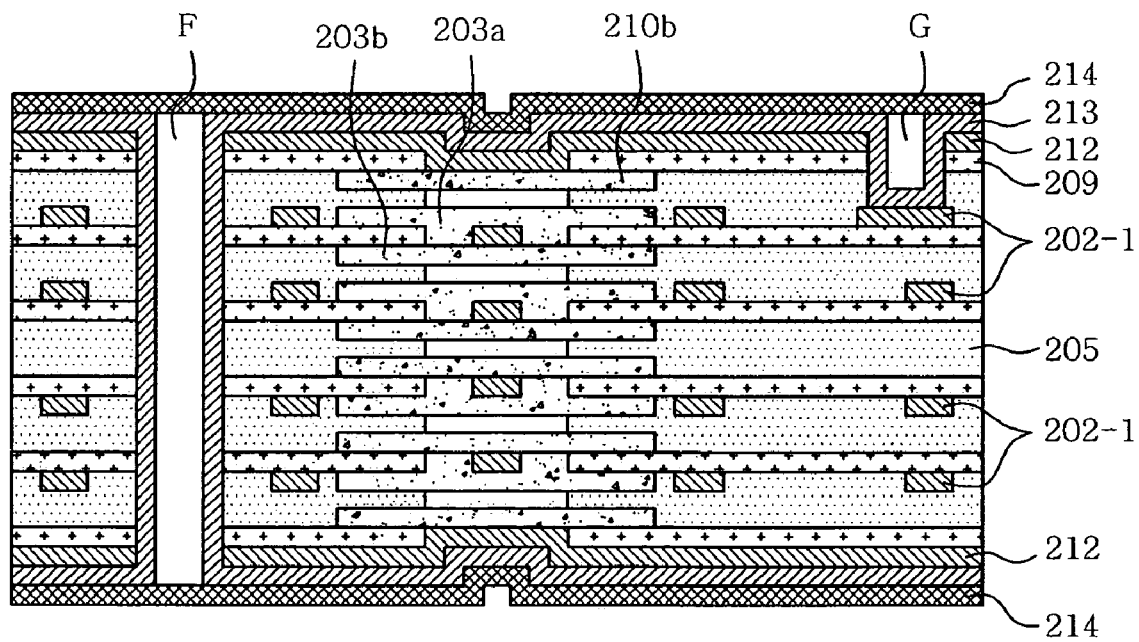
Figure 2P:
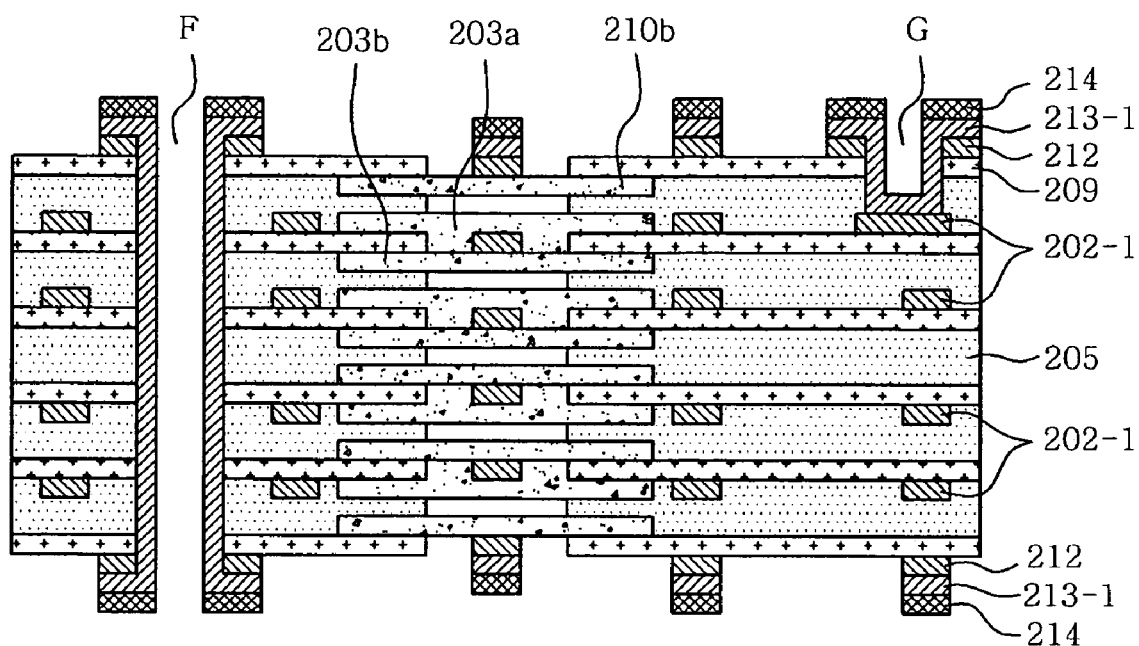
Figure 2Q:
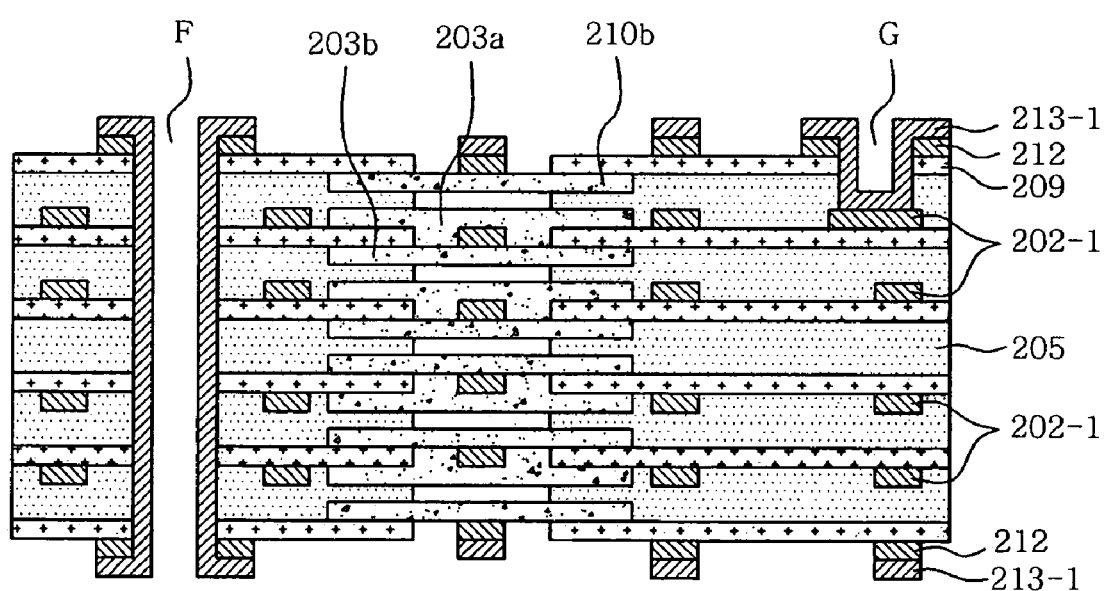
Figure 2R:
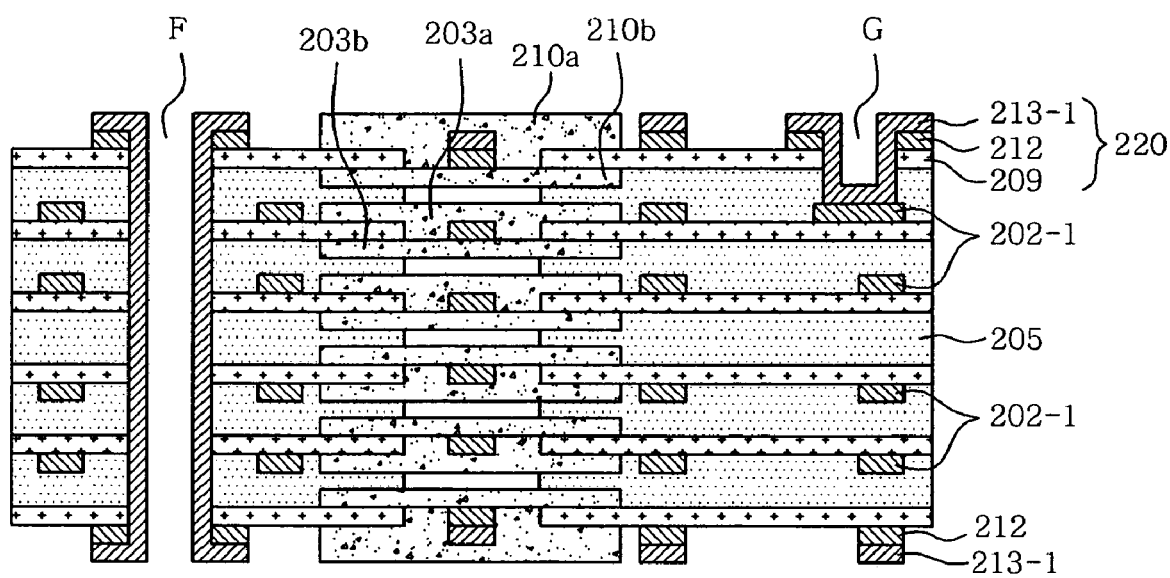

FIGS. 2A to 2R are sectional views illustrating the fabrication of a rigid flexible PCB, according to an embodiment of the present invention.

As shown in FIG. 2A, a window (C) is formed through a first prepreg 201. The window (C) may be formed through the first prepreg 201 using a punch or a drill bit. The window (C) constitutes a flexible portion of a final product.

In FIG. 2B, a copper foil 202 is applied on an upper side of the first prepreg 201, and a protective film, such as a first coverlay 203b, is applied on a lower side of the first prepreg so as to cover the window (C). Subsequently, pressing is conducted. After the copper foil 202 is applied and then pressed, a portion of the copper foil 202, which corresponds in position to the window (C), is pushed in the window (C) as shown in FIG. 2B and thus comes into contact with an adhesive of the first coverlay 203b, thereby adhesion is achieved. The first coverlay 203b acts as a support layer for supporting a circuit pattern of the copper foil 202 formed in the window (C) of the first prepreg 201, and provides continuous flexibility to the rigid flexible PCB according to the present embodiment of the invention.

Meanwhile, the first coverlay 203b may be partially applied so as to cover only the window (C) of the first prepreg 201 as shown in FIG. 2B, or may be applied on the entire surface of the first prepreg 201.

In connection with this, a single step press process may be conducted so as to simultaneously press the first prepreg 201, the copper foil 202, and the first coverlay 203b.

Next, as shown in FIG. 2C, a dry film 204 is applied on the copper foil 202. A liquid photoresist may be used instead of the dry film 204.

As shown in FIG. 2D, an artwork film having a predetermined pattern printed thereon is attached to the dry film 204, exposed, and developed to form a predetermined etching resist pattern. The resulting substrate is dipped in an etching solution, and, at this time, the dry film 204 or the liquid photoresist acts as an etching resist. Thereby, a portion of the copper foil 202, which corresponds in position to a portion other than a predetermined pattern of the dry film 204, is removed. It is preferable to use an aqueous solution of sodium carbonate ($Na_2CO_3$) or potassium carbonate ($K_2CO_3$) as a developing solution.

As shown in FIG. 2E, the dry film 204 is removed using a stripping solution to form a predetermined internal circuit pattern 202-1. In connection with this, it is preferable to use a stripping solution containing sodium hydroxide (NaOH) or potassium hydroxide (KOH).

In FIG. 2F, a second coverlay 203a is applied so as to protect the internal circuit pattern 202-1 formed in the predetermined window (C) of the first prepreg 201. In connection with this, the second coverlay 203a may be partially applied so as to cover only the window (C) of the first prepreg 201, or may be applied on the entire surface of the first prepreg 201.

In the present embodiment described referring to FIGS. 2A to 2F, the copper foil 202 is layered on one side of the first prepreg 201 through which the window (C) is formed, and the first coverlay 203b is applied on the other side of the first prepreg so as to cover the window (C). Subsequently, the internal circuit pattern 202-1 is formed on the copper foil 202, and the second coverlay 203a is applied so as to correspond in position to the first coverlay 203b and protect the internal circuit pattern 202-1 in the window (C), thereby a circuit layer 200 is formed.

Next, as shown in FIG. 2g, a second prepreg 205, through which a window (D) is formed, is prepared for additional lamination. In connection with this, the window (D) is formed so as to correspond in position to the window (C) of the first prepreg 201, and a punch or a drill bit may be used to form it.

Meanwhile, preferably, an insulating layer is used as the second prepreg 205. However, a bonding sheet may be used instead, or any insulator may be used as long as the insulator has adhesiveness and the shape of a plate. The second prepreg 205 is material in which glass fibers are impregnated in resin, and has excellent dimensional stability and thermal stability but poor adhesion strength. The bonding sheet is made only of resin, thus it has excellent adhesion strength, but poor thermal stability and workability.

It is more preferable to use the first and second prepregs 201, 205 made of the same material. However, in the drawings, for the convenience of description, different hatching styles are used therein. Furthermore, it is preferable that the material of the second prepreg 205 be thicker than that of the first prepreg 201 as shown in FIG. 2H. However, they may have the same thickness.

In a typical process of fabricating a rigid flexible PCB, the thickness of the prepreg used as an insulating layer is about 40-100 µm, but it is preferable that the thickness of the second prepreg 205 according to the present embodiment of the invention be 40 µm in consideration of thickness, workability, and economic efficiency of final products. In connection with this, the bonding sheet having a thickness of 15-25 µm may be used instead of the second prepreg 205 in order to form a thin plate.

As shown in FIG. 2H, the circuit layers 200 (see FIG. 2F) are layered on both sides of the second prepreg 205. The resulting structure may be used as a first internal layer 207 of the PCB as described later.

Furthermore, as shown in FIG. 2I, a second internal layer 208 in which the circuit layer 200 is layered on one side of the second prepreg 205 is prepared.

Additionally, as shown in FIG. 2J, an insulating substrate 211 in which a third coverlay 210b is applied on one side of a third prepreg 209 so as to cover a window (E) is prepared. Corresponding in position to the window (C) of the first prepreg 201 and the window (D) of the second prepreg 205, the window (E) is formed through the third prepreg 209.

Next, as shown in FIG. 2K, the second internal layers 208, the second prepregs 205, the insulating substrates 211, and copper foil layers 212 are sequentially layered on both sides of the first internal layer 207, and the resulting structure is pressed by pressing both sides thereof to form a six-layered PCB as shown in FIG. 2L. It is possible to control the number of PCBs depending on the embodiment.

In connection with this, the circuit layers 200 and the second prepregs 205 are alternately layered so that the internal circuit patterns 202-1 are positioned outward, and the insulating substrates 211 and the copper foil layers 212 are layered so as to constitute an outermost layer. The resulting structure is heat pressed to form the six-layered PCB as shown in FIG. 2L.

In FIG. 2M, a plurality of via holes, including a through hole (F) and a blind via hole (G), is formed. The through hole (F) is formed to connect all layers of the PCB, and the blind via hole (G) is formed to connect the external circuit pattern to the circuit pattern therebeneath. It is preferable that the through hole (F) be formed using mechanical drilling and the blind via hole (G) be formed using laser drilling.

Next, as shown in FIG. 2N, copper plating layers 213 are formed by plating in order to achieve an electric connection through the walls of the holes. The walls of the holes comprise the first prepreg 201, the second prepreg 205, and the third prepreg 209 made of insulating resin, thus it is preferable to form the copper plating layers 213 having excellent physical properties through an electrolytic copper plating process after cleaning of the walls of the holes and an electroless copper plating process are conducted.

As shown in FIG. 2O, dry films 214 are applied on the copper plating layers 213, exposed, and developed to form predetermined etching resist patterns.

Next, as shown in FIG. 2P, the resulting PCB is etched to remove portions of the copper plating layers 213, which correspond to portions other than predetermined patterns of the dry films 214. As shown in FIG. 2Q, the dry films 214 used as an etching resist pattern are stripped, thereby external circuit patterns 213-1 are formed.

Finally, as shown in FIG. 2R, the window (E) is plugged, and fourth coverlays 210a are applied so as to protect the external circuit patterns 213-1 corresponding in position to the window (E) to form external layers 220, thereby the rigid flexible PCB according to the present embodiment of the invention is created. Depending on the embodiment, pre-treatment processes, such as surface treatment, or post-treatment processes may be additionally conducted.

In the rigid flexible PCB and the method of fabricating the same according to the present embodiment of the invention, the first, second, third, and fourth coverlays used as the protective film may be a typical film type, a liquid type, or a dry film type.

Meanwhile, in FIG. 2R, portions of the PCB, in which the first prepregs 201, the second prepregs 205, and the third prepregs 209 are embedded, constitute rigid portions, and the center portion of the PCB through which the windows (C, D, and E) are formed constitutes a flexible portion.

In other words, the rigid portions comprise a plurality of circuit layers which has the circuit patterns formed thereon and a plurality of insulating layers which is interposed between the circuit layers. The flexible portion, which is capable of being modified in three dimensions, comprises a pair of protective films and a plurality of circuit patterns interposed therebetween.

In the present embodiment of the invention, the PCBs are symmetrically layered on both sides of the first internal layer 207 shown in FIG. 2H. However, after a plurality of second internal layers 208 and second prepregs 205 are layered on one side of the first internal layer 207, the insulating substrate 211 and the copper foil layer 212 may be layered on both sides of the resulting PCB, followed by the processes shown in FIGS. 2M to 2R.

FIGS. 3A to 3K are sectional views illustrating the fabrication of a rigid flexible PCB, according to another embodiment of the present invention.

Figure 3A:
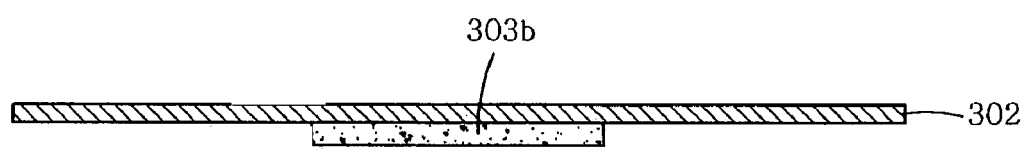
FIGS. 3A to 3K are sectional views illustrating the fabrication of a rigid flexible PCB, according to another embodiment of the present invention.

First, as shown in FIG. 3A, a first coverlay 303b having a predetermined size is applied on one side of a copper foil layer 302.

In connection with this, the first coverlay 303b is applied to protect a circuit pattern of a flexible portion to be formed, and may be partially or entirely applied on the copper foil layer 302.

Figure 3B:
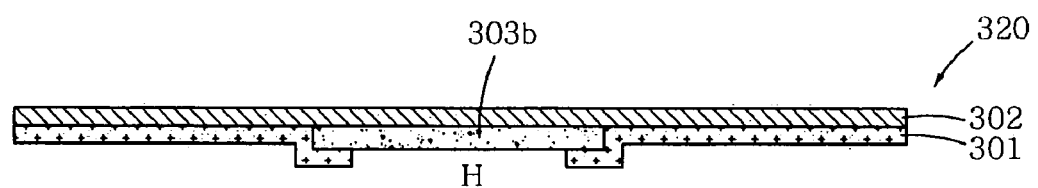

Subsequently, as shown in FIG. 3B, a first prepreg 301, through which a window (H) having a size that is identical to or smaller than that of the first coverlay 303b is formed, is layered on one side of the copper foil layer 302 so as to expose the first coverlay 303b.

In connection with this, the window (H) of the first prepreg 301 constitutes a flexible portion of the rigid flexible PCB according to the present embodiment of the invention.

Meanwhile, the window (H) may be formed using a punching process or a drill bit.

Figure 3C:
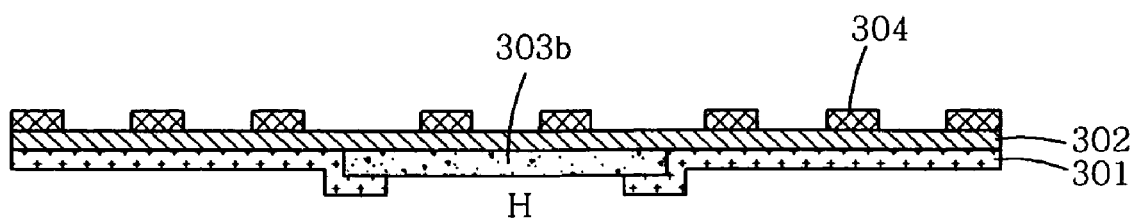

Next, as shown in FIG. 3C, an etching resist pattern 304 is formed on the other side of the copper foil layer 302.

In an example of formation of the etching resist pattern 304, an artwork film having a predetermined circuit pattern printed thereon is attached to a photoresist, such as a dry film, exposed, and developed to form the etching resist pattern 304 having the predetermined circuit pattern formed thereon.

Figure 3D:
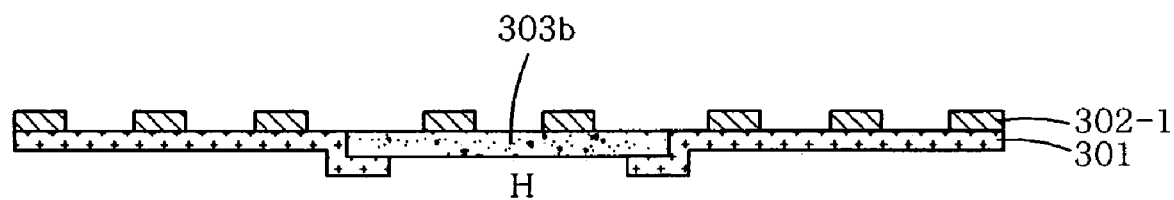

Subsequently, as shown in FIG. 3D, the copper foil layer 302 on which the etching resist pattern 304 is formed is etched to form an internal circuit pattern 302-1.

In other words, the copper foil layer 302 on which the etching resist pattern 304 is formed is dipped in an etching solution to remove a portion of the copper foil layer 302, which corresponds in position to a portion other than the etching resist pattern 304, and the etching resist pattern 304 is then stripped to form the internal circuit pattern 302-1.

Figure 3E:
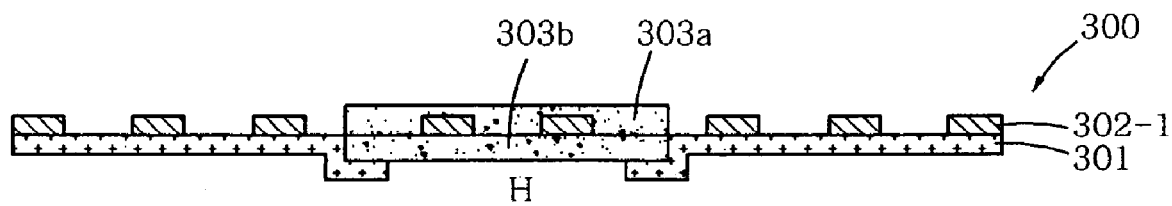

Next, as shown in FIG. 3E, a second coverlay 303a is applied on the internal circuit pattern 302-1 so as to correspond in position to the first coverlay 303b and protect the internal circuit pattern 302-1 formed on the first coverlay 303b, thereby forming a circuit layer 300.

As described above, in the rigid flexible PCB according to the present embodiment of the invention, the first coverlay 303b and the second coverlay 303a for protecting the internal circuit pattern 302-1 constitute a flexible portion, thus it is possible to form the flexible portion having flexibility that is the same as polyimide even though a polyimide copper clad laminate is not used.

Figure 3F:
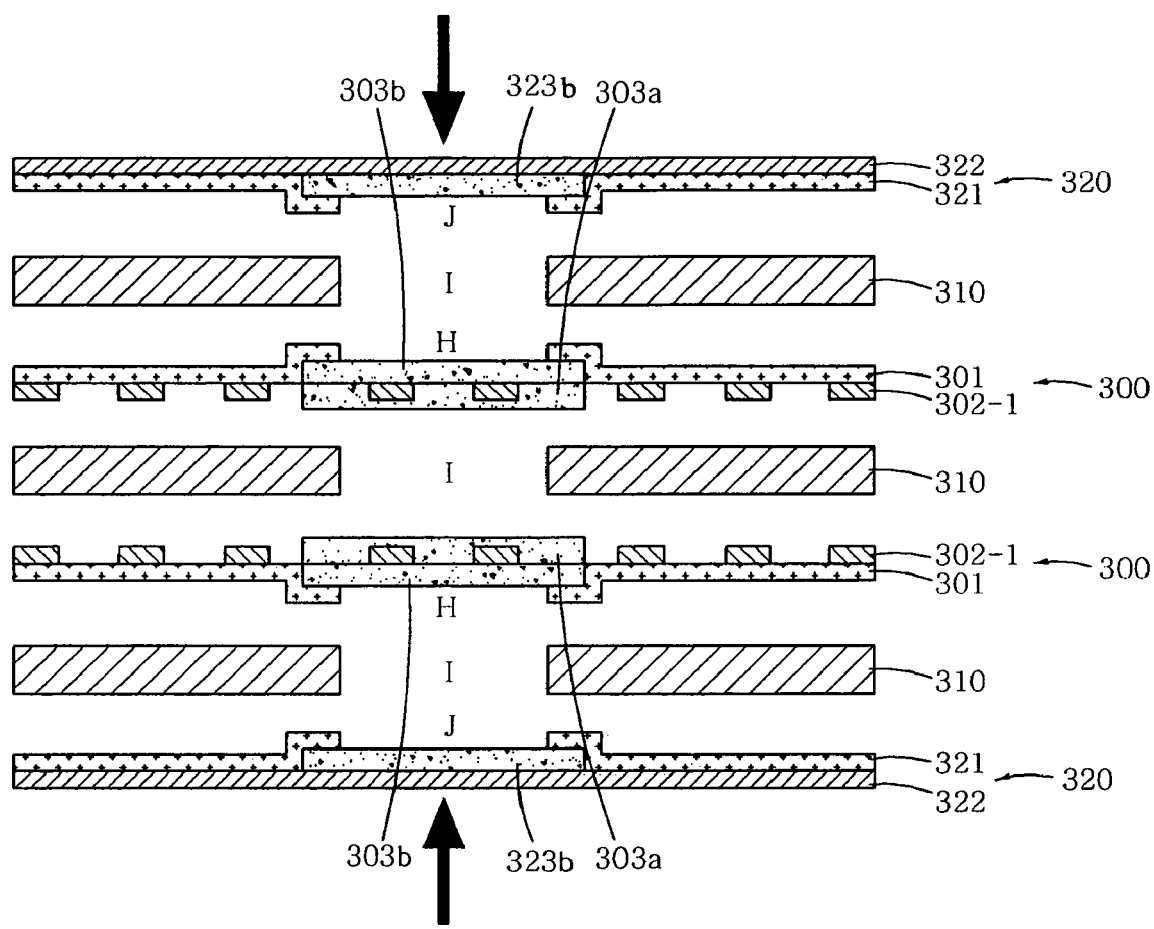

Subsequently, as shown in FIG. 3F, a plurality of circuit layers 300 and a plurality of second prepregs 310 through which windows (I) are formed are alternately layered. Preliminary external layers 320, in which each of third prepregs 321 having windows (J) is layered on one side of each of copper foil layers 322 coated with coverlays 323b, are layered so as to constitute uppermost and lowermost parts of the resulting structure.

The window (J) is formed through the third prepreg 321 so as to correspond in position to the window (I) formed through the second prepreg 310 and to the window (H) formed through the first prepreg 301.

The third prepreg 321, the second prepreg 310, and the first prepreg 301 may be made of the same material, but, for the convenience of description, different hatching styles are used in the drawings. Furthermore, a bonding sheet may be used instead of the semi-cured prepregs 301, 310, 321 constituting insulating layers.

Additionally, in a typical process of fabricating a rigid flexible PCB, the thickness of a prepreg is about 40-100 μm, but it is preferable that the thicknesses of the prepregs 301, 310, 321 in the rigid flexible PCB according to the present invention be 40 μm in consideration of thickness, workability, and economic efficiency of final products. In connection with this, a bonding sheet having a thickness of 15-25 μm may be used instead of the prepreg in order to form a thin plate.

Meanwhile, the prepregs 301, 310, 321 increase the mechanical strength of a rigid portion of the rigid flexible PCB according to the present invention, and act as an adhesive layer during a subsequent heat pressing process.

Figure 3G:
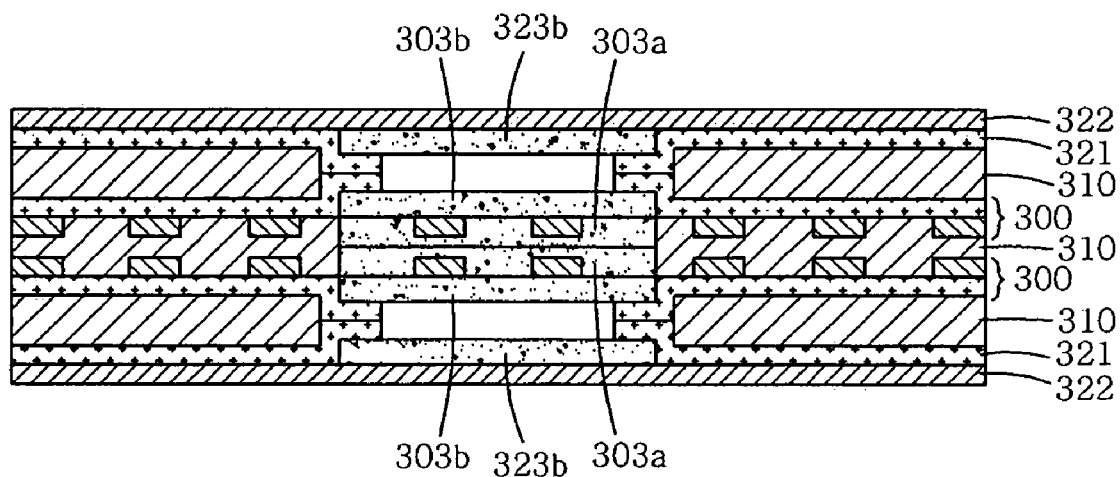

Next, as shown in FIG. 3G, a plurality of circuit layers 300, a plurality of second prepregs 310, and the preliminary external layers 320 which are layered are heat pressed.

Figure 3H:
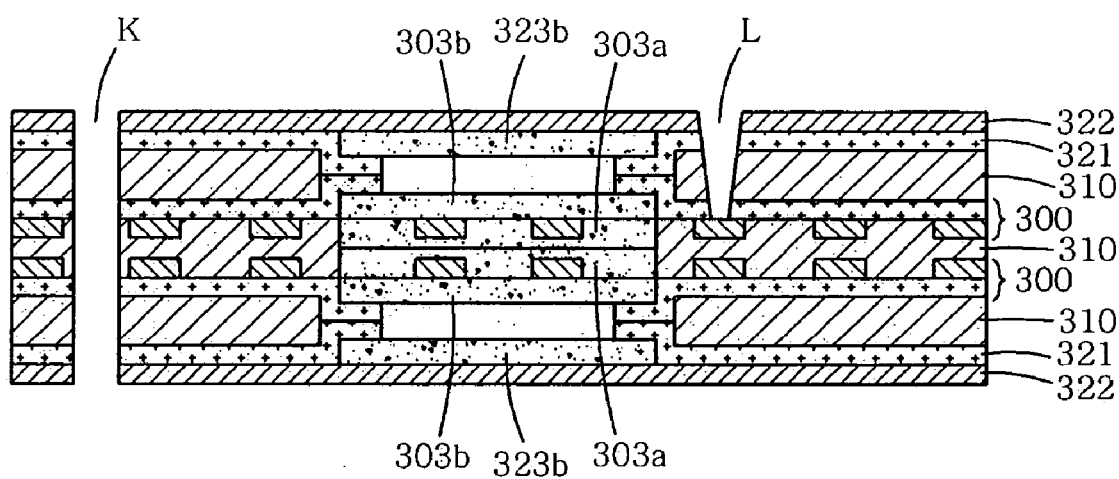

Subsequently, as shown in FIG. 3H, a through hole (K) and a blind via hole (L) are formed for interlayer electric connection.

The through hole (K) is formed so as to connect all layers of the PCB, and the blind via hole (L) is formed so as to connect the external layer to the circuit layer therebeneath. They may be formed using mechanical drilling or laser drilling.

Figure 3I:
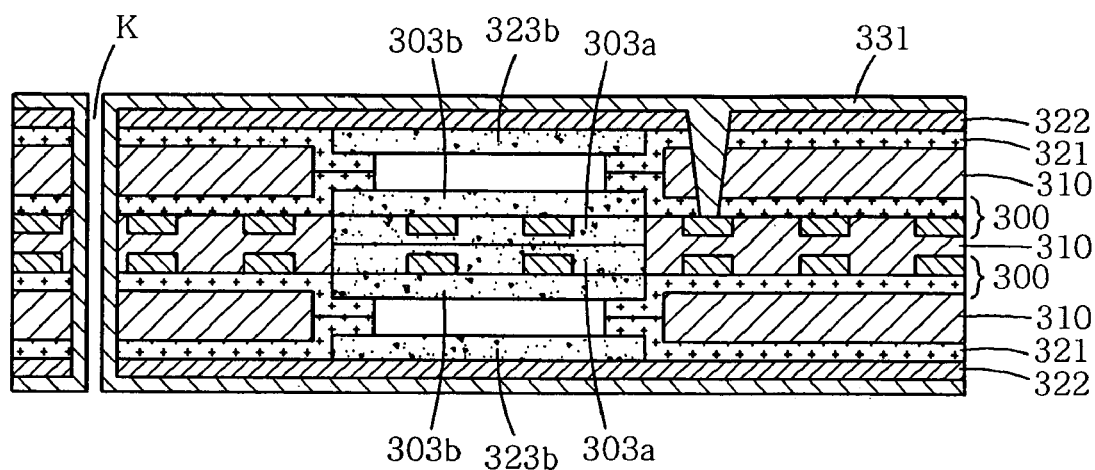

Next, as shown in FIG. 3I, copper plating layers 331 are formed on copper foil layers 322, and on walls of the through hole (K) and the blind via hole (L) so as to achieve electric connection through the walls of the holes.

The copper plating layers 331 are formed by conducting electroless and electrolytic copper plating processes, and the blind via hole (L) may be filled with the copper plating layers 331.

Figure 3J:
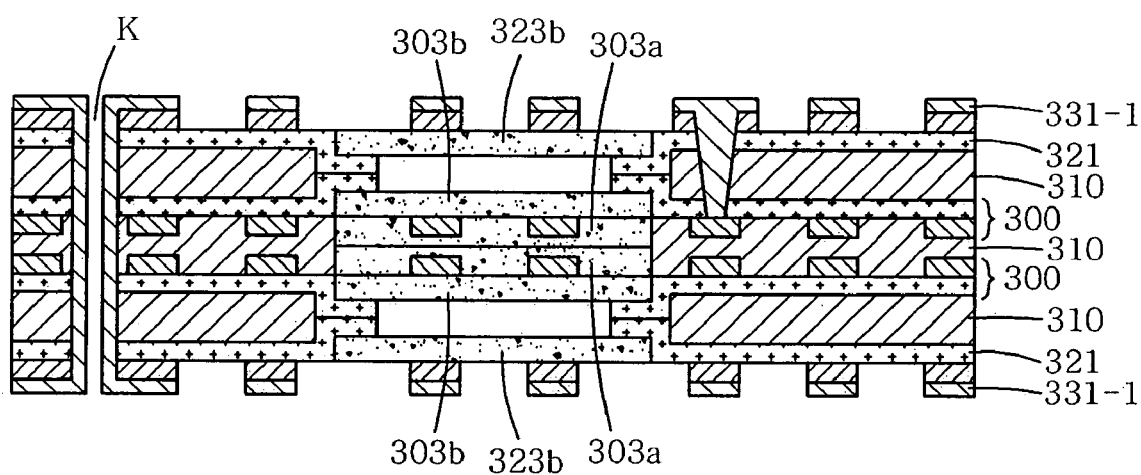

Subsequently, as shown in FIG. 3J, etching resist patterns (not shown) are formed on the copper plating layers 331, and an etching process is then carried out to form external circuit patterns 331-1.

Figure 3K:
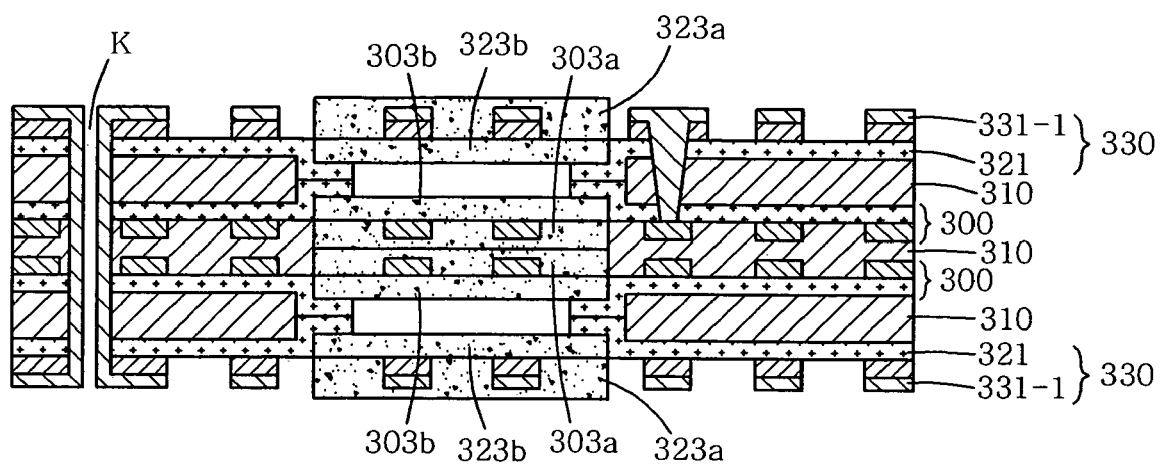

Finally, as shown in FIG. 3K, fourth coverlays 323a are applied so as to correspond in position to the third coverlays 323b and protect the external circuit patterns 331-1 to form external layers 330, thereby the rigid flexible PCB according to the present embodiment of the invention is created.

In connection with this, the fourth coverlays 323a may be applied on entire surfaces of the external circuit patterns 331-1.

In the rigid flexible PCB and the method of fabricating the same according to the present embodiment of the invention, the first, second, third, and fourth coverlays used as a protective film may be a typical film type, a liquid type, or a dry film type.

Meanwhile, in FIG. 3K, portions of the PCB, in which the first prepregs 301, the second prepregs 310, and the third prepregs 321 are embedded, constitute rigid portions, and the center portion of the PCB, through which the windows (H, I, and J) are formed, constitutes a flexible portion.

In other words, the rigid portions comprise a plurality of circuit layers which has the circuit patterns formed thereon and a plurality of insulating layers which is interposed between the circuit layers. The flexible portion, which is capable of being modified in three dimensions, comprises a pair of protective films and a plurality of circuit patterns interposed therebetween.

Figure 4A:
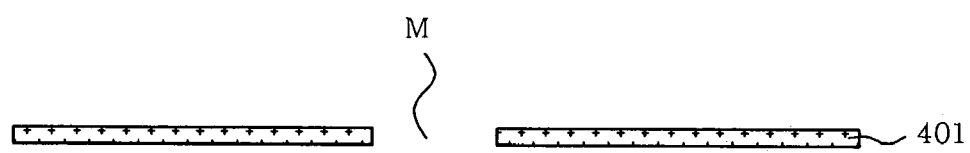
FIGS. 4A to 4R are sectional views illustrating the fabrication of a rigid flexible PCB, according to yet another embodiment of the present invention.
Figure 4B:
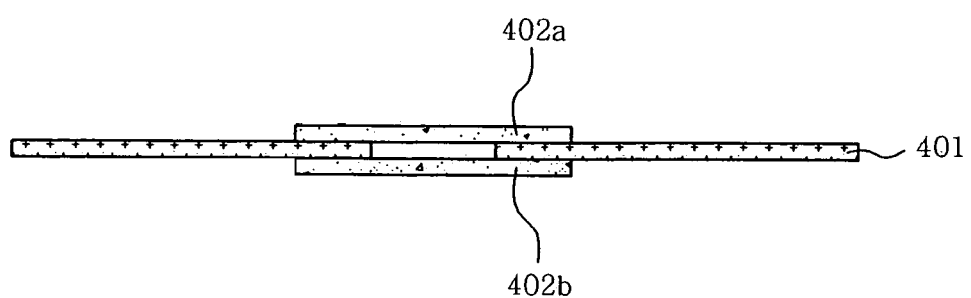
Figure 4C:
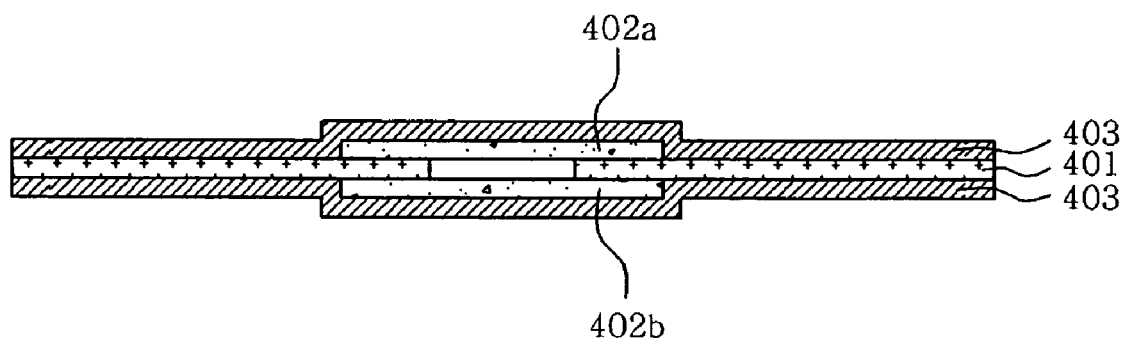
Figure 4D:
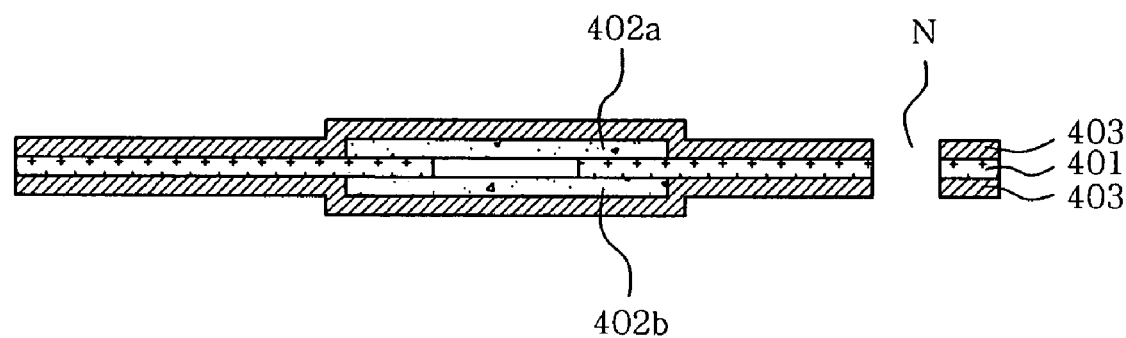
Figure 4E:
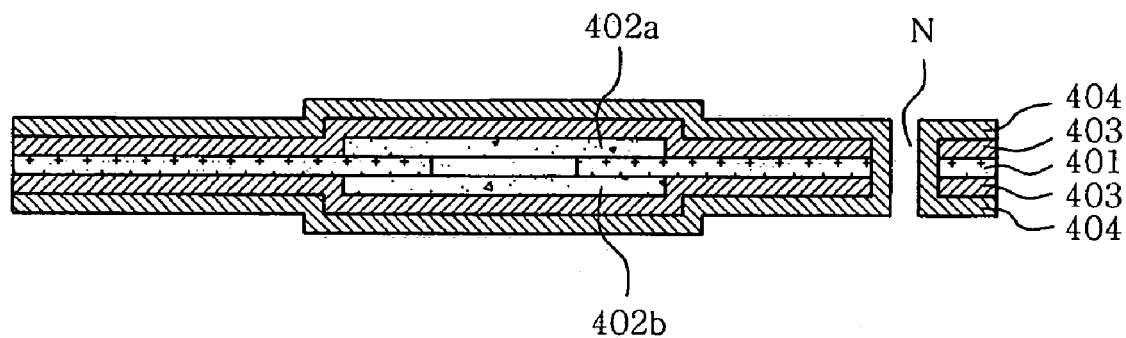
Figure 4F:
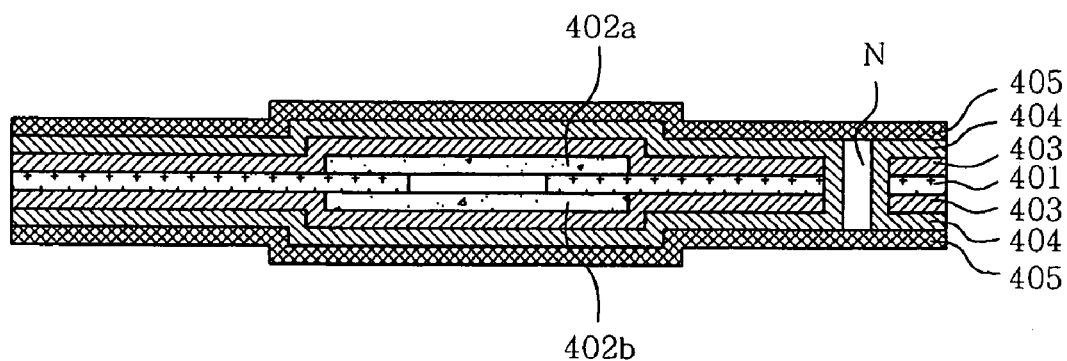
Figure 4G:
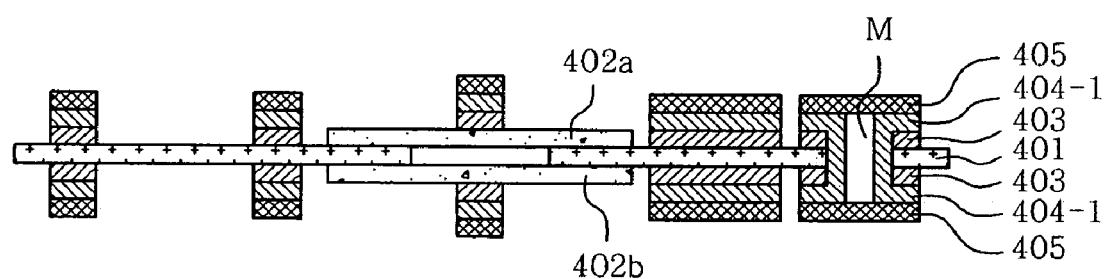
Figure 4H:
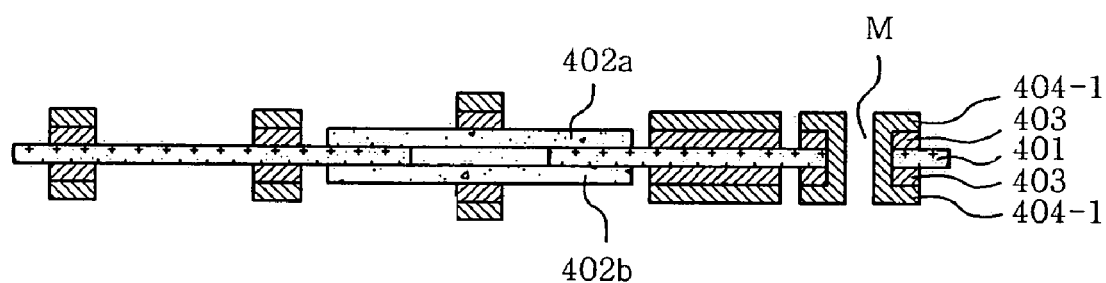
Figure 4I:
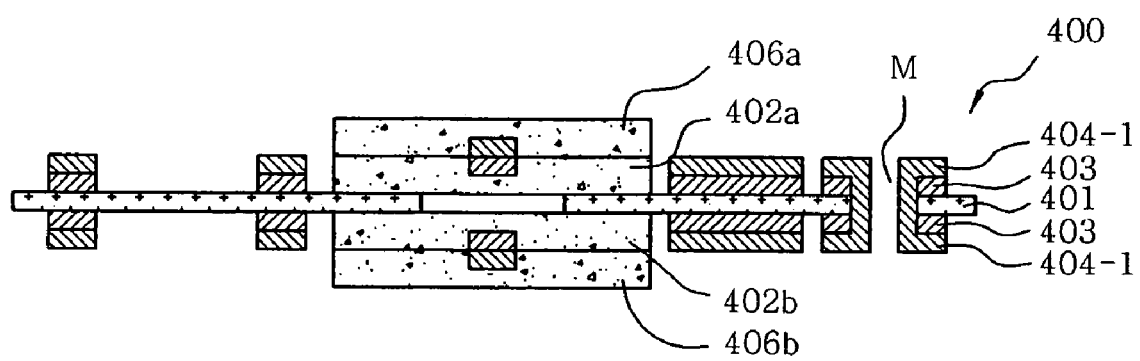
Figure 4J:
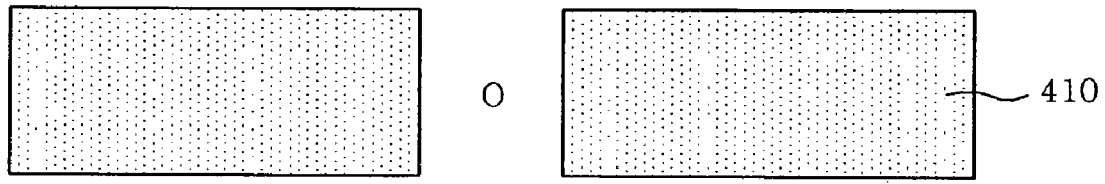
Figure 4K:
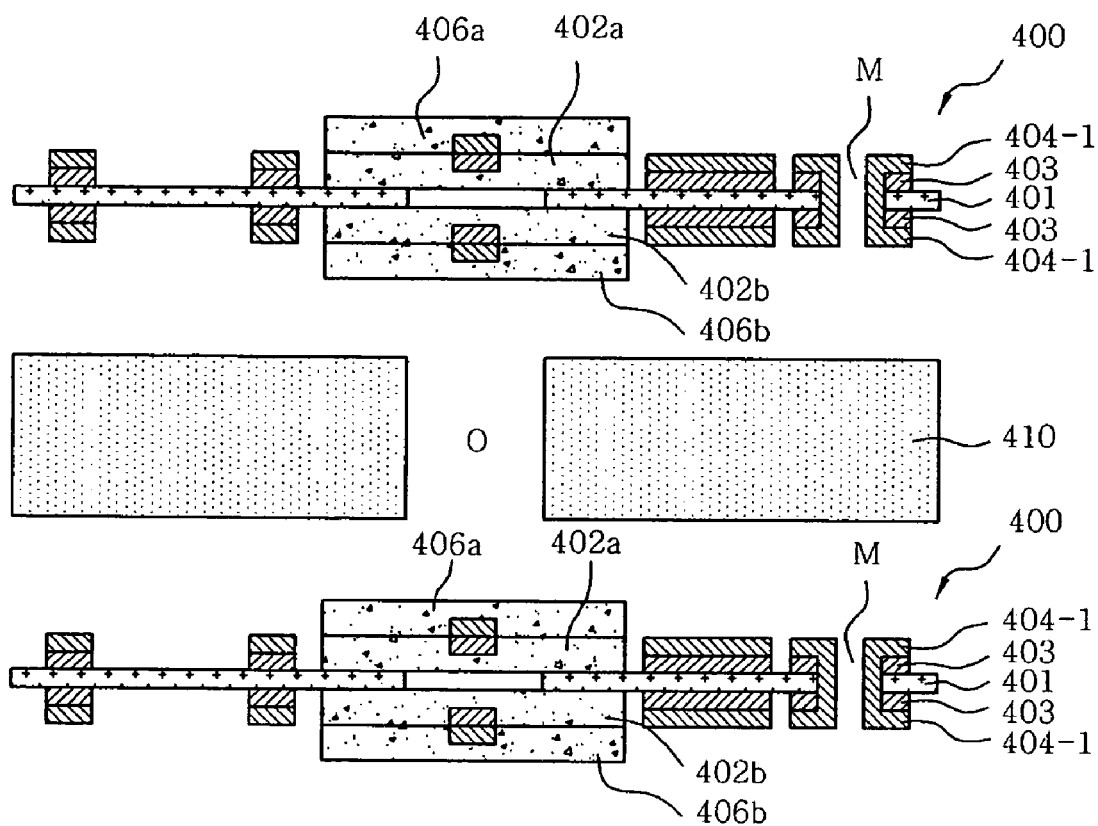
Figure 4L:
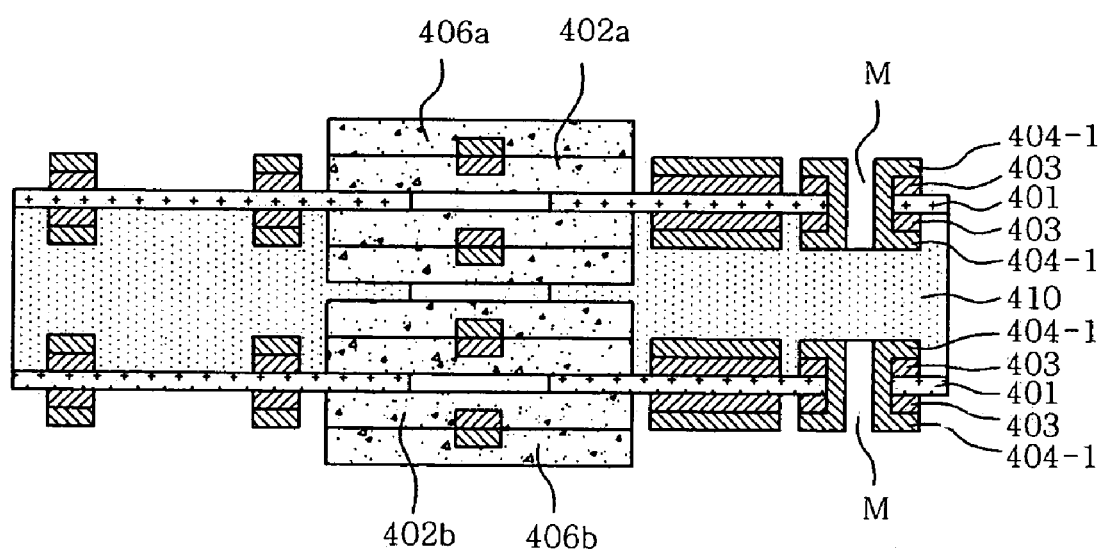
Figure 4M:
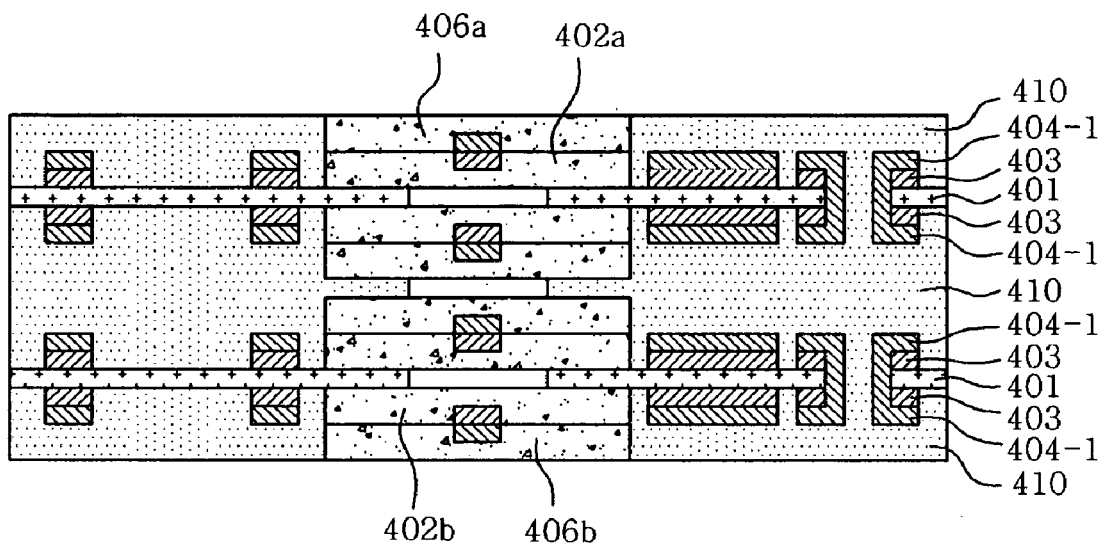
Figure 4N:
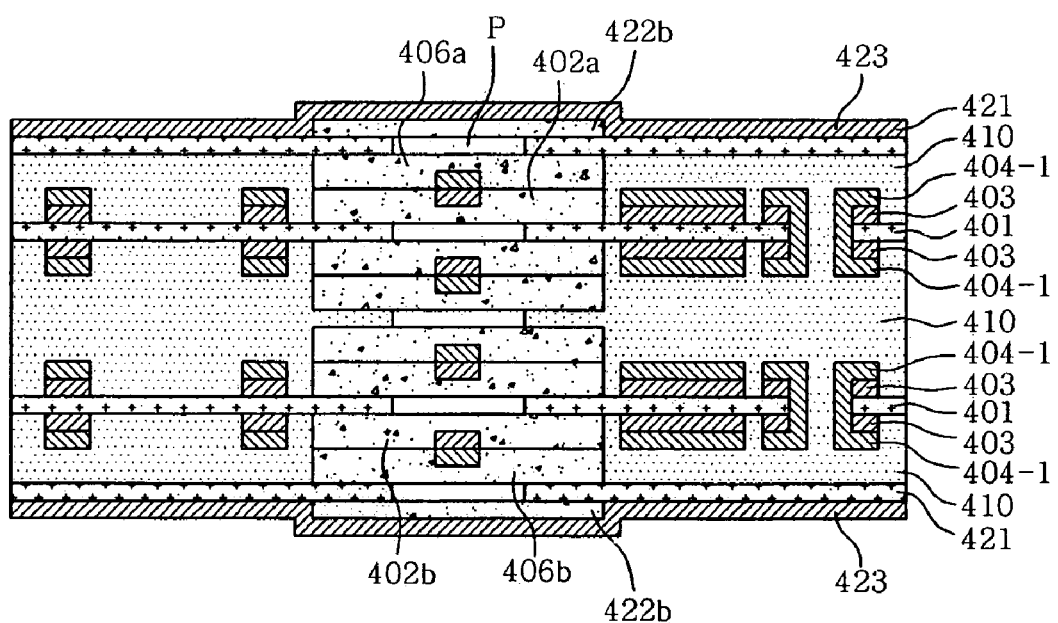
Figure 4O:
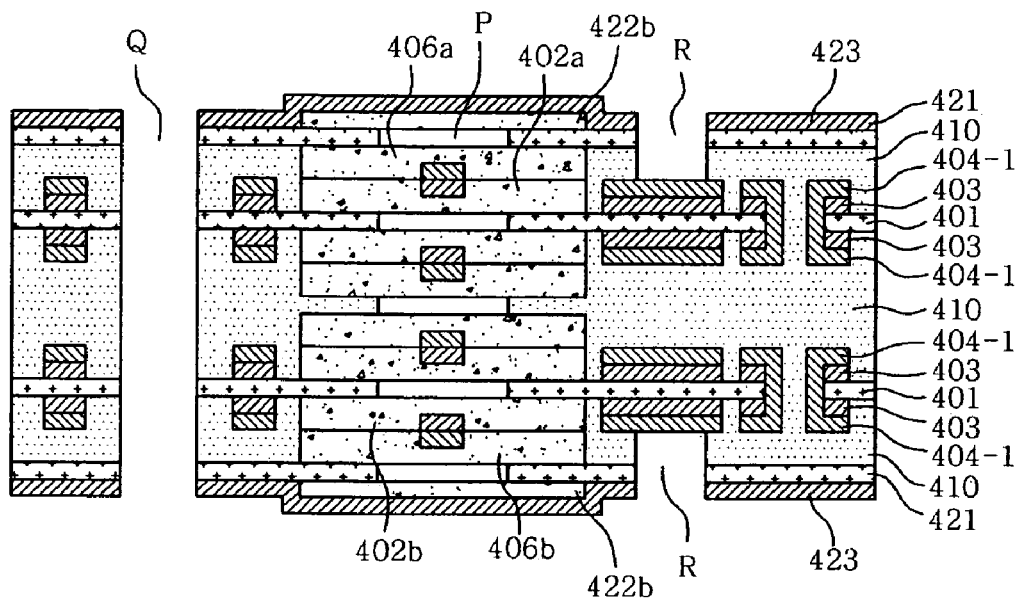
Figure 4P:
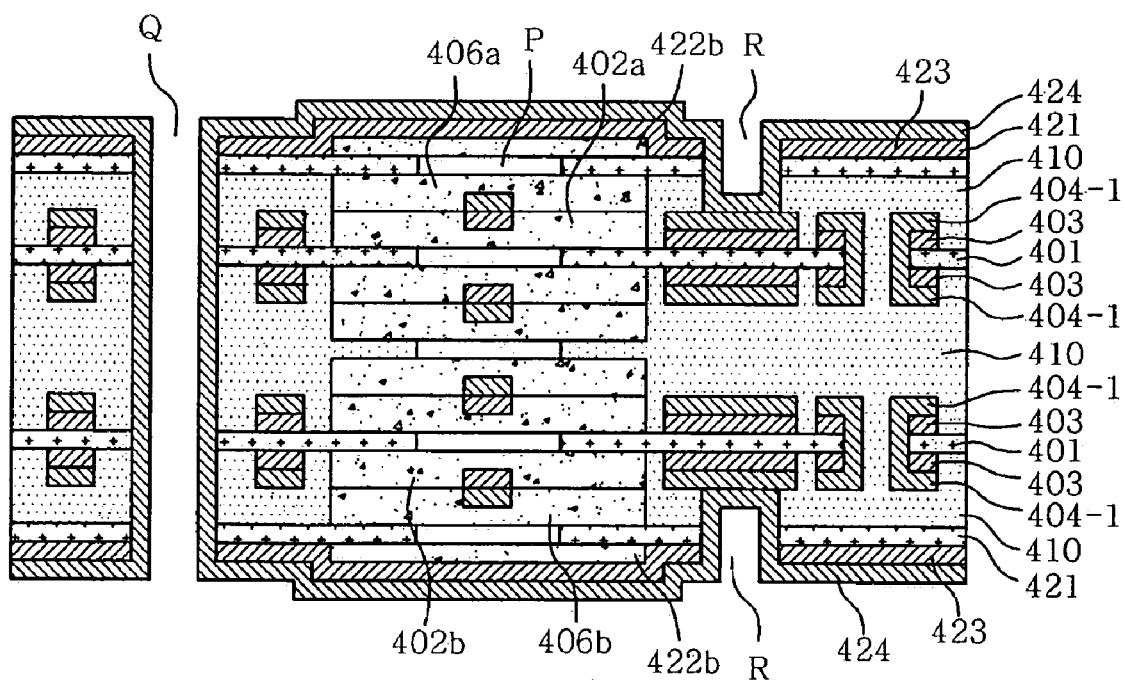
Figure 4Q:
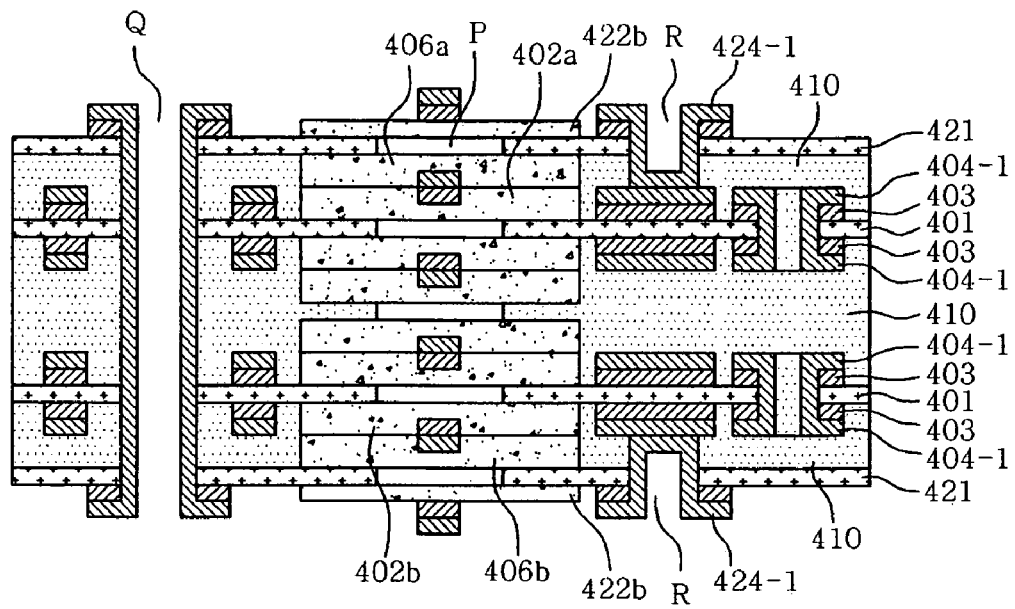
Figure 4R:
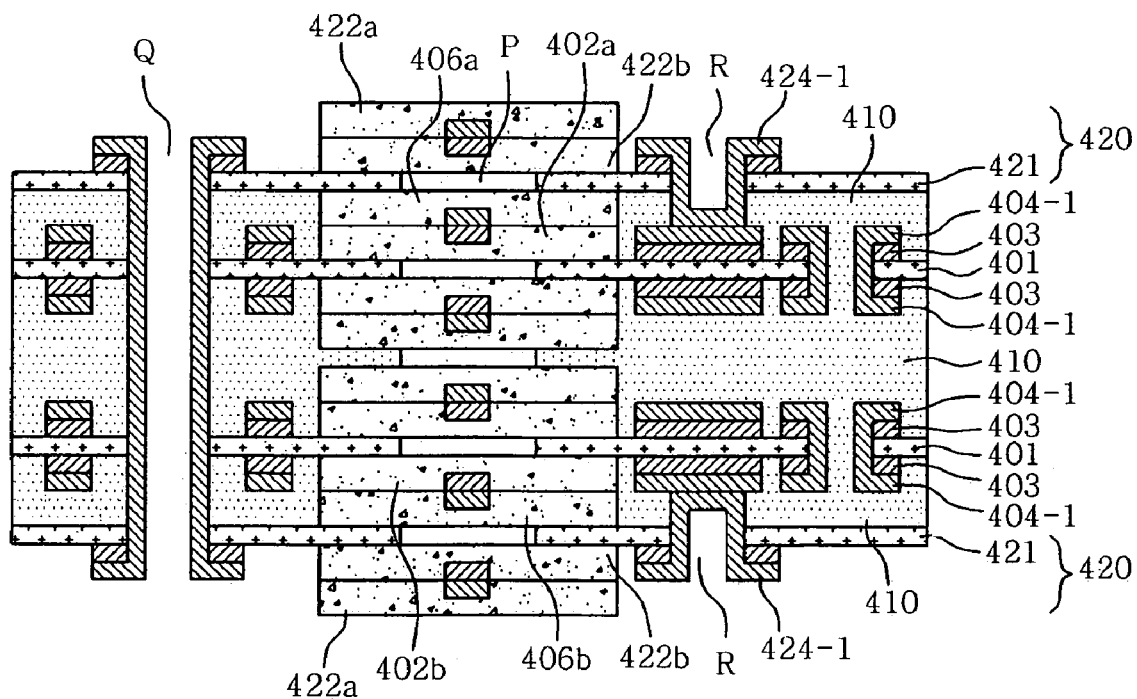

FIGS. 4A to 4R are sectional views illustrating the fabrication of a six-layered rigid flexible PCB through double-side lamination, according to yet another embodiment of the present invention.

First, as shown in FIG. 4A, a first prepreg 401 through which a window (M) having a predetermined size is formed is prepared. The window (M) may be formed using a punch or a drill bit.

Next, as shown in FIG. 4B, protective films, such as a first coverlay 402a and a second coverlay 402b, are applied on both sides of the first prepreg 401. The first coverlay 402a and the second coverlay 402b are formed so as to cover circuit patterns to be formed in a subsequent process and thus protect them. In FIG. 4B, they are partially applied so as to cover only the window (M). However, the first coverlay 402a and the second coverlay 402b may be applied on the entire surface of a substrate.

In FIG. 4C, copper foil layers 403 are applied on both sides of the resulting first prepreg 401 which includes the first coverlay 402a and the second coverlay 402b, and then pressed. In connection with this, a single step press process may be conducted so as to simultaneously press the first prepreg 401, the first coverlay 402a, the second coverlay 402b, and the copper foil layers 403.

After the pressing is conducted, an internal via hole (N) is formed as shown in FIG. 4D.

As shown in FIG. 4E, copper plating layers 404 are formed on copper foil layers 403 so as to achieve interlayer electric connection through a wall of the internal via hole (N). Since the first prepreg 401 which is made of an insulator and constitutes the wall of the via hole (N) is exposed, an electrolytic copper plating process is conducted after an electroless copper plating process is carried out in order to form the copper plating layers 404.

In FIG. 4F, dry films 405, which are to be used as an etching resist, are applied on the copper plating layers 404. Other etching resist materials, such as a liquid photoresist, may be applied instead of the dry films 405. Subsequently, artwork films having a predetermined pattern printed thereon are attached to the dry films 405, exposed, and developed to form predetermined etching resist patterns.

In FIG. 4G, the resulting substrate is dipped in an etching solution to etch portions of the copper foil layers 403 and the copper plating layers 404, which correspond in position to portions other than predetermined patterns of the dry films 405.

As shown in FIG. 4H, the dry films 405 are removed using a stripping solution to form predetermined internal circuit patterns 404-1. In connection with this, a stripping solution containing sodium hydroxide (NaOH) or potassium hydroxide (KOH) is used to remove them.

As shown in FIG. 4I, a third coverlay 406a and a fourth coverlay 406b are applied so as to correspond to the first coverlay 402a and the second coverlay 402b, and to protect the internal circuit patterns 404-1 formed on the first coverlay 402a and the second coverlay 402b, thereby a circuit layer 400 is formed. In connection with this, the third coverlay 406a and the fourth coverlay 406b may be applied on the entire surface of the substrate.

Furthermore, as shown in FIG. 4J, an insulating layer, such as a second prepreg 410 or a bonding sheet, through which a window (O) is formed to correspond in position to the window (M) of the first prepreg 401, is prepared. The second prepreg 410 and the first prepreg 401 may be made of the same material, but, for the convenience of description, different hatching styles are used in the drawings.

It is preferable that the second prepreg 410 of FIG. 4J be thicker than the first prepreg 401. For example, it is preferable that the second prepreg 410 be made of material having a thickness of about 60 μm and the first prepreg 401 be made of material having a thickness of about 40 μm. Depending on the embodiment, the second prepreg 410 and the first prepreg 401 may have the same thickness.

Next, as shown in FIG. 4K, the circuit layers 400 are formed on both sides of the second prepreg 410, and, as shown in FIG. 4L, pressing is conducted using heat and pressure to form a four-layered PCB.

Additionally, as shown in FIG. 4M, the second prepregs 410 are layered on both sides of the PCB of FIG. 4K.

Subsequently, as shown in FIG. 4N, third prepregs 421, through which windows (P) are formed so as to correspond in position to the windows (M) of the first prepregs 401 and the windows (O) of the second prepregs 410, and first sides of which are coated with fifth coverlays 422b so that the fifth coverlays cover the windows (P), and copper foil layers 423 are layered and then pressed.

As shown in FIG. 4O, a through hole (Q) is formed for total electric connection of the PCB and a blind via hole (R) is formed so as to achieve electric connection between two layers.

Subsequently, as shown in FIG. 4P, copper plating layers 424 are formed so as to achieve electric connection through walls of the holes. In connection with this, since the first, second, and third prepregs 401, 410, 421, which constitute the walls of the holes and are made of an insulator, are exposed, the copper plating layers 424 having excellent physical properties are formed through an electrolytic copper plating process after an electroless copper plating process is conducted.

Next, as shown in FIG. 4Q, etching resist patterns (not shown) are formed on the copper plating layers 424, and an etching process is then conducted to form external circuit patterns 424-1.

Finally, as shown in FIG. 4R, sixth coverlays 422a are applied so as to correspond in position to the fifth coverlays 422b and protect the external circuit patterns 424-1 formed on the fifth coverlays 422b to form external layers 420, thereby the rigid flexible PCB according to the present embodiment of the invention is created.

In the rigid flexible PCB and the method of fabricating the same according to the present embodiment of the invention, the first, second, third, fourth, fifth, and sixth coverlays used as a protective film may be a typical film type, a liquid type, or a dry film type.

Meanwhile, as shown in FIG. 4R, the PCB according to the present embodiment of the invention comprises a plurality of double-sided circuit layers 400, a plurality of second prepregs 410, and the external layers 420 so that they are layered. The number of circuit layers 400 and second prepregs 410 may vary.

Portions of the PCB of FIG. 4R, in which the first, second, and third prepregs 401, 410, 421 are embedded, constitute rigid portions, and the center portion of the PCB, through which the windows (M, O, and P) are formed, constitutes a flexible portion.

In other words, the rigid portions include a plurality of circuit layers and a plurality of insulating layers interposed between the circuit layers. The flexible portion includes a pair of protective films and a plurality of circuit layers interposed therebetween.

To fabricate the rigid flexible PCB according to the present embodiment of the invention, a plurality of circuit layers 400 and a plurality of second prepregs 410 are alternately layered. The third prepregs 421 having the windows (P), first sides of which are coated with the fifth coverlays 422b so that the fifth coverlays cover the windows (P), and the copper foil layers 423 are layered so as to constitute outermost portions of the resulting structure, and are heat pressed. Subsequently, processes of FIGS. 4O to 4R are conducted to fabricate the rigid flexible PCB.

As well, in the rigid flexible PCB according to the present invention, the circuit pattern of the flexible portion is formed using the coverlay, and the insulating layer through which the window is formed is layered to form the rigid portions, thus it is possible to fabricate the rigid flexible PCB without using a polyimide copper clad laminate.

In other words, instead of the costly polyimide copper clad laminate, the low-priced coverlay supports the flexible portion and connects the rigid portions to each other, thus the reliability of adhesion is excellent, bendability is realized, there are no bursts in a bent portion, and the price of final products is reduced.

Although the embodiments of the present invention have been disclosed for illustrative purposes, those skilled in the art will appreciate that various modifications, additions and substitutions are possible, without departing from the scope and spirit of the invention as disclosed in the accompanying claims.

As described above, in the present invention, since it is unnecessary to use a costly polyimide copper clad laminate (PICCL) in which a copper foil is attached to a polyimide film, the fabrication cost of a PCB is significantly reduced.

Furthermore, the PCB of the present invention is low-cost and has a bent portion which does not comprise a prepreg but a coverlay, thus it is possible to fabricate products which assure excellent reliability of adhesion and flexibility that is identical to that of a typical product.

What is claimed is:

1. A method of fabricating a rigid flexible printed circuit board, comprising the steps of:

preparing a circuit layer, the circuit layer comprising:
a first insulating layer through which a first window is formed;

an internal circuit pattern which is formed on a side of the first insulating layer having the first window; and first and second protective films for protecting a portion of the internal circuit pattern formed in the first window;

preparing a second insulating layer through which a second window is formed so as to correspond to the first window;

layering a plurality of circuit layers and a plurality of second insulating layers to form a laminate; and forming external layers, through which third windows are formed so as to correspond to the first and second windows, on upper and lower sides of the laminate, each of the external layers comprising:

an external circuit pattern which corresponds to the internal circuit pattern; and third and fourth protective films which protect a portion of the external circuit pattern formed in each of the third windows, wherein a portion corresponding to the first, second, and third windows is a flexible portion.

2. The method as set forth in claim 1, wherein the step of preparing a circuit layer comprises the steps of:

providing the first insulating layer through which the first window is formed;

applying the first protective film on a side of the first insulating layer to cover the first window;

layering a copper foil layer on the other side of the first insulating layer;

forming the internal circuit pattern on the copper foil layer; and applying the second protective film to protect a portion of the internal circuit pattern formed in the first window in conjunction with the first protective film.

3. The method as set forth in claim 1, wherein the step of preparing a circuit layer comprises the steps of:

applying the first protective film having a predetermined size on a side of the copper foil layer;

layering the first insulating layer, through which the first window that is smaller than the first protective film is formed, on the side of the copper foil layer to expose a portion of the first protective film;

forming the internal circuit pattern on the copper foil layer; and applying the second protective film on the internal circuit pattern so that the second protective film corresponds to the first protective film and protects the internal circuit pattern.

4. The method as set forth in claim 1, wherein the first insulating layer and the second insulating layer are at least one of a prepreg and a bonding sheet.

5. The method as set forth in claim 1, wherein the first, second, third, and fourth protective films are at least one of a typical film type of coverlay, a liquid type of coverlay, and a dry film type of coverlay.

6. The method as set forth in claim 1, wherein the step of forming external layers comprises the steps of:

layering preliminary external layers on the upper and lower sides of the laminate, each of the preliminary external layers comprising:

a third insulating layer through which the third window having a size and a position that are identical to those of the first window and the second window is formed; and the third protective film which is formed on the third insulating layer to cover the copper foil layer formed on a side of the third insulating layer and the third window;

forming the external circuit pattern through which a plurality of via holes is formed on the copper foil layer; and applying the fourth protective film to protect a portion of the external circuit pattern in the third window in conjunction with the third protective film, thereby forming the external layers.

7. The method as set forth in claim 6, wherein forming the plurality of via holes comprises the step of forming through holes and blind via holes.

8. A method of fabricating a rigid flexible printed circuit board, comprising the steps of:

forming first and second internal circuit patterns, which are electrically connected to each other, on both sides of a first insulating layer through which a first window is formed, and applying first, second, third, and fourth protective films, which correspond to the first window, on both sides of the first insulating layer to protect portions of the first and second internal circuit patterns in the first window, thus preparing a circuit layer;

preparing a second insulating layer through which a second window is formed so as to correspond to the first window;

layering a plurality of circuit layers and a plurality of second insulating layers to form a laminate; and forming external layers, through which third windows are formed so as to correspond to the first and second windows, on upper and lower sides of the laminate, each of the external layers comprising:

an external circuit pattern which corresponds to the first and second internal circuit patterns; and fifth and sixth protective films which protect a portion of the external circuit pattern formed in each of the third windows, wherein a portion corresponding to the first, second, and third windows is a flexible portion.

9. The method as set forth in claim 8, wherein the step of forming first and second internal circuit patterns comprises the steps of:

providing the first insulating layer through which the first window is formed;

applying the first protective film and the second protective film on upper and lower sides of the first insulating layer to cover the first window;

layering a copper foil layer on the upper and lower sides of the first insulating layer on which the first protective film and the second protective film are applied;

forming an internal via hole through the copper foil layer, and conducting electroless and electrolytic copper plating processes;

forming the first and second internal circuit patterns on the copper foil layer; and applying the third protective film and the fourth protective film on the first protective film and the second protective film to protect the first and second internal circuit patterns.

10. The method as set forth in claim 8, wherein the first insulating layer and the second insulating layer are at least one of a prepreg and a bonding sheet.

11. The method as set forth in claim 8, wherein the first, second, third, fourth, fifth, and sixth protective films are at least one of a typical film type of coverlay, a liquid type of coverlay, and a dry film type of coverlay.

12. The method as set forth in claim 8, wherein the step of forming external layers comprises the steps of:

layering preliminary external layers on the upper and lower sides of the laminate, each of the preliminary external layers comprising:

a third insulating layer through which the third window having a size and a position that are identical to those of the first window and the second window is formed; and the fifth protective film which is formed on the third insulating layer to cover the copper foil layer formed on a side of the third insulating layer and the third window;

forming the external circuit pattern through which a plurality of via holes is formed on the copper foil layer; and applying the sixth protective film to protect a portion of the external circuit pattern in the third window in conjunction with the fifth protective film, thereby forming the external layers.

13. The method as set forth in claim 12, wherein forming the plurality of via holes comprises the step of forming through holes and blind via holes.

* * * * *